US012751007B2

(12) United States Patent
Kim et al.

(10) Patent No.: US 12,751,007 B2
(45) Date of Patent: Sep. 29, 2026

(54) MEMORY DEVICE WITH REDUCED RESISTANCE

(71) Applicant: SK hynix Inc., Icheon-si (KR)

(72) Inventors: Chul Young Kim, Icheon-si (KR); Jin Ho Bin, Icheon-si (KR); Hyun Sub Kim, Icheon-si (KR); Young Tae Yoo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 937 days.

(21) Appl. No.: 17/874,849

(22) Filed: Jul. 27, 2022

(65) Prior Publication Data

US 2023/0301090 A1 Sep. 21, 2023

(30) Foreign Application Priority Data

Mar. 17, 2022 (KR) ........................ 10-2022-0033639

(51) Int. Cl.

*H10B 43/27* (2023.01)
*G11C 16/04* (2006.01)
*H10B 43/10* (2023.01)
*H10B 43/35* (2023.01)

(52) U.S. Cl.

CPC ......... *H10B 43/27* (2023.02); *G11C 16/0483* (2013.01); *H10B 43/10* (2023.02); *H10B 43/35* (2023.02)

(58) Field of Classification Search

CPC . H01L 27/1027; H01L 27/1028; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50

See application file for complete search history.

(56) References Cited

U.S. PATENT DOCUMENTS 10,361,218 B2 7/2019 Arai
2012/0199897 A1* 8/2012 Chang .................. H10D 84/038 257/314
2012/0275220 A1* 11/2012 Liu ........................ H10B 43/27 257/E21.423
2016/0027796 A1* 1/2016 Yang ...................... H10B 43/50 257/314
2021/0257379 A1* 8/2021 Cui ...................... H10D 30/693

FOREIGN PATENT DOCUMENTS

KR 102007274 B1 8/2019
KR 1020210063527 A 6/2021

* cited by examiner

*Primary Examiner* — William B Partridge
*Assistant Examiner* — Gustavo G Ramallo
(74) *Attorney, Agent, or Firm* — WILLIAM PARK AND ASSOCIATES LTD.

(57) ABSTRACT

There are provided a memory device and a manufacturing method of the memory device. The memory device includes: a source structure; and a stack structure over the source structure, the stack structure including a plug and a slit, wherein the slit includes a source contact being connected to the source structure.

20 Claims, 23 Drawing Sheets

MEMORY DEVICE WITH REDUCED RESISTANCE

CROSS-REFERENCE TO RELATED APPLICATION

The present application claims priority under 35 U.S.C. § 119(a) to Korean patent application number 10-2022-0033639 filed on Mar. 17, 2022, in the Korean Intellectual Property Office, the entire disclosure of which is incorporated by reference herein.

BACKGROUND

1. Technical Field

The present disclosure generally relates to a memory device and a manufacturing method of the memory device, and more particularly, to a memory device having a three-dimensional structure and a manufacturing method of the memory device.

2. Related Art

A memory device may be classified into a volatile memory device in which stored data is lost when the supply of power is interrupted and a nonvolatile memory device in which stored data is retained even when the supply of power is interrupted.

The nonvolatile memory device may include a NAND flash memory, a NOR flash memory, a resistive random access memory (ReRAM), a phase-change random access memory (PRAM), a magnetoresistive random access memory (MRAM), a ferroelectric random access memory (FRAM), a spin transfer torque random access memory (STT-RAM), and the like.

Among these, memory cells included in the NAND flash memory may be included in a string connected between a bit line and a source line. The string may include first select transistors, memory cells, and second select transistors, which are connected between the bit line and the source line. Gates of the first select transistors may be connected first select lines, gates of the memory cells may be connected to word lines, and gates of the second select transistors may be connected to second select lines.

SUMMARY

In accordance with an aspect of the present disclosure, there may be provided a memory device including: a source structure; and a stack structure over the source structure, the stack structure including a plug and a slit, wherein the slit includes a source contact being connected to the source structure, wherein a region in which the plug and the source structure overlap with each other includes a compensation layer, the compensation layer includes a first concentration of an impurity and the source structure includes a second concentration of the impurity, and the first concentration is greater than the second concentration.

In accordance with another aspect of the present disclosure, there may be provided a method of manufacturing a memory device, the method including: stacking a first source layer, a first sacrificial layer, and a second source layer on a lower structure; forming a landing hole exposing a portion of the first source layer by etching portions of the second source layer, the first sacrificial layer, and the first source layer; forming a compensation layer in the first and second source layers by implanting an impurity into surfaces of the first and second source layers, which are exposed through the inside of the landing hole; filling a second sacrificial layer inside the landing hole in which the compensation layer is formed; forming third sacrificial layers and interlayer insulating layers, which are alternately stacked, on the entire structure including the second sacrificial layer; forming a plug hole exposing the second sacrificial layer by etching portions of the third sacrificial layers and the interlayer insulating layers; removing the second sacrificial layer exposed through the plug hole; and forming a plug inside the plug hole and the landing hole.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being “between” two elements, it can be the only element between the two elements, or one or more intervening elements may also be present. Like reference numerals refer to like elements throughout. It is also to be understood that when a layer is referred to as being “on” another layer, structure, or substrate etc., it can be directly on the other layer, structure, or substrate etc., or intervening layers, structures, or substrates etc., may also be present. It is also noted that in this specification, “connected/coupled” refers to one component not only directly coupling another component but also indirectly coupling another component through an intermediate component. In addition, a singular form may include a plural form, and vice versa as long as it is not specifically mentioned.

FIGS. 6A, 6B, 6C, 6D, 6E, 6F, 6G, 6H, 6I, 63, 6K, 6L, 6M, 6N, 6O, and 6P are views illustrating a manufacturing method of the memory device in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a memory device and a manufacturing method of the memory device, which can reduce a resistance between a source structure and a plug.

Figure 1:
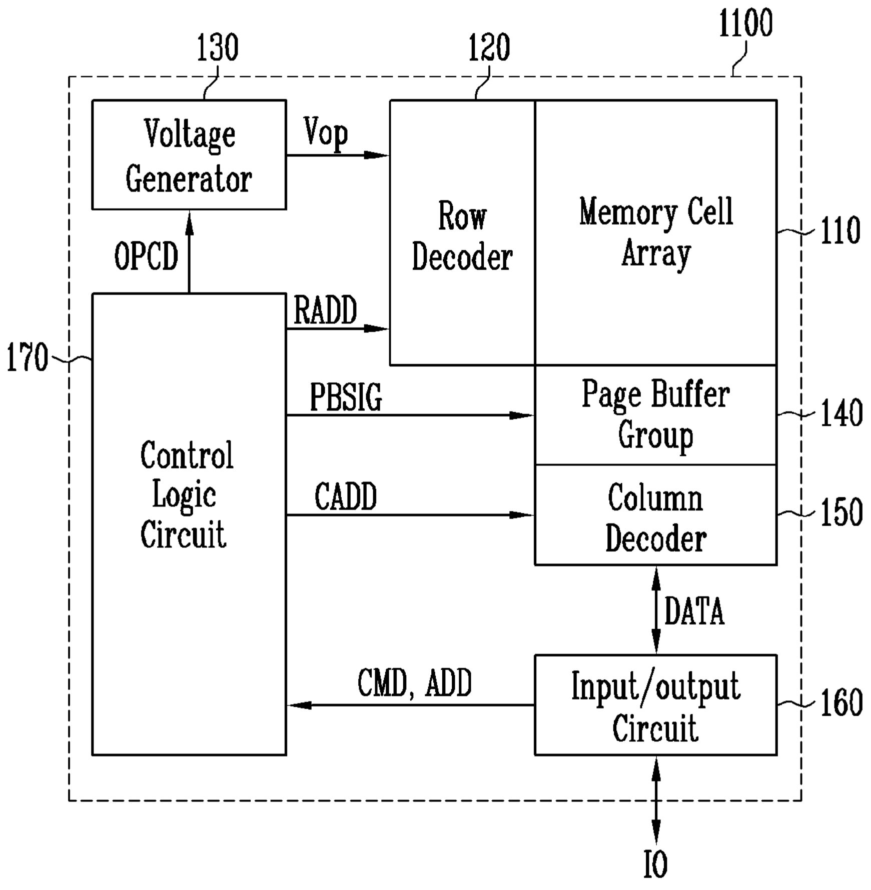
FIG. 1 is a diagram illustrating a memory device in accordance with an embodiment of the present disclosure.

FIG. 1 is a diagram illustrating a memory device in accordance with an embodiment of the present disclosure.

Referring to FIG. 1, the memory device 1100 may include a memory cell array 110 in which data is stored and peripheral circuits 120 to 170 capable of performing a program, read or erase operation.

The memory cell array 110 may include a plurality of memory blocks in which data is stored. Each of the memory blocks may include memory cells, and the memory cells may be implemented in a three-dimensional structure in which the memory cells are stacked in a vertical direction above a substrate.

The peripheral circuits 120 to 170 may include a row decoder 120, a voltage generator 130, a page buffer group 140, a column decoder 150, an input/output circuit 160, and a control logic circuit 170.

The row decoder 120 may select one memory block among the memory blocks included in the memory cell array 110 according to a row address RADD, and transmit operating voltages Vop to the selected memory block.

The voltage generator 130 may generate and output the operating voltages Vop necessary for various operations in response to an operation code OPCD. For example, the voltage generator 130 may generate a program voltage, a read voltage, an erase voltage, a pass voltage, a turn-on voltage, a ground voltage, and the like in response to the operation code OPCD, and selectively output the generated voltages.

The page buffer group 140 may be connected to the memory cell array 110 through bit lines. For example, the page buffer group 140 may include page buffers connected to the respective bit lines. The page buffers may simultaneously operate in response to page buffer control signals PBSIG, and temporarily store data in a program, read or verify operation. The page buffers may sense a current of the bit lines, which varies according to threshold voltages of the memory cells, in a read or verify operation.

The column decoder 150 may transmit data DATA between the input/output circuit 160 and the page buffer group 140 according to a column address CADD.

The input/output circuit 160 may be connected to an external device through input/output lines IO. For example, the external device may be a controller capable of transmitting a command CMD, an address ADD, or data DATA to the memory device 1100. The input/output circuit 160 may input/output a command CMD, an address ADD, and data DATA through the input/output lines IO. For example, the input/output circuit 160 may transmit the command CMD and the address ADD, which are received from the external device, to the control logic circuit 170 through the input/output lines IO, and transmit the data DATA received from the external device to the column decoder 150 through the input/output lines IO. The input/output circuit 160 may output the data DATA received from the column decoder 150 to the external device through the input/output lines IO.

The control logic circuit 170 output the operation code OPCD, the row address RADD, the page buffer control signals PBSIG, and the column address CADD in response to the command CMD and the address ADD. For example, the control logic circuit 170 may include software for performing an algorithm in response to the command CMD and hardware for outputting the address ADD and various control signals.

Figure 2:
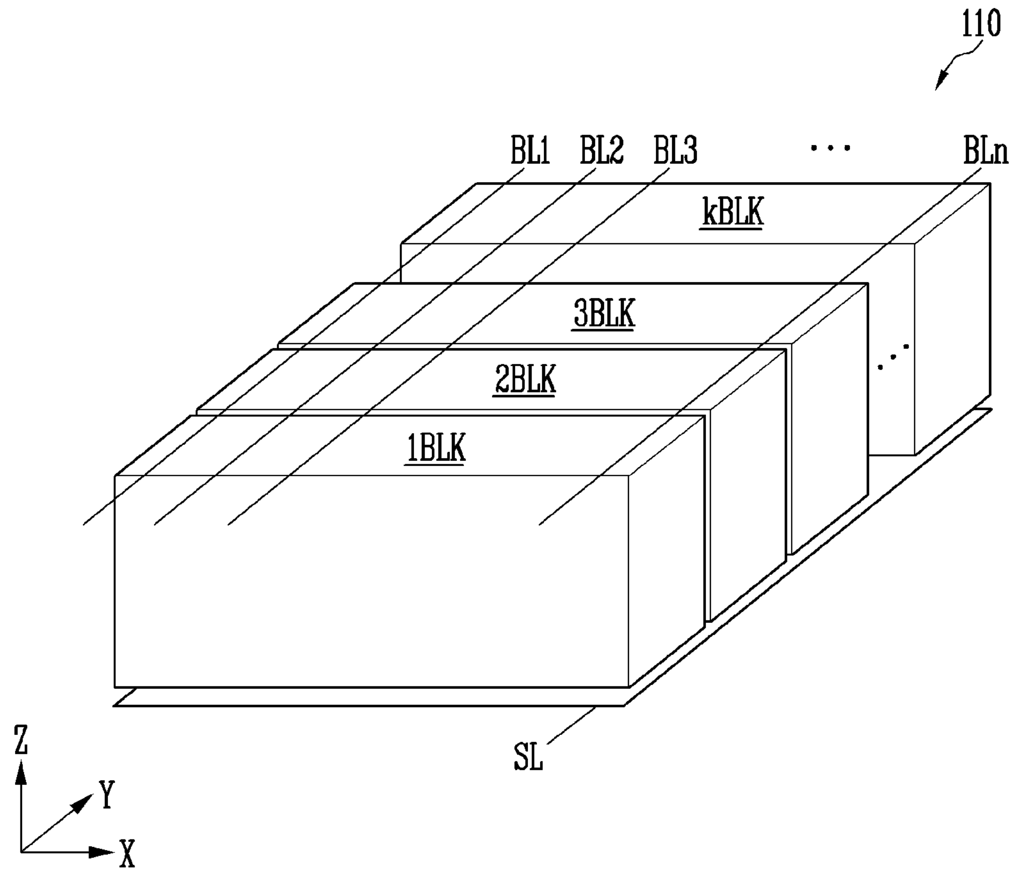
FIG. 2 is a diagram illustrating a memory cell array.

FIG. 2 is a diagram illustrating a memory cell array.

Referring to FIG. 2, the memory cell array 110 may include first to kth memory blocks 1BLK to kBLK (k is a positive integer). Each of the first to kth memory blocks 1BLK to kBLK may include a plurality of memory cells stacked in a vertical direction from a substrate. The first to kth memory blocks 1BLK to kBLK may be disposed between a source structure SL and first to nth bit lines BL1 to BLn. The source structure SL may be a source line connected to a memory block. For example, when the first to nth bit lines BL1 to BLn are disposed to be spaced apart from each other in a first direction (X direction) and are formed to extend in a second direction (Y direction) perpendicular to the first direction (X direction), the first to kth memory blocks 1BLK to kBLK may be disposed to be spaced apart from each other along the second direction (Y direction). Therefore, the memory cells included in the first to kth memory blocks 1BLK to kBLK may be stacked along a third direction (Z direction) perpendicular to the first and second directions (X and Y directions).

Figure 3:
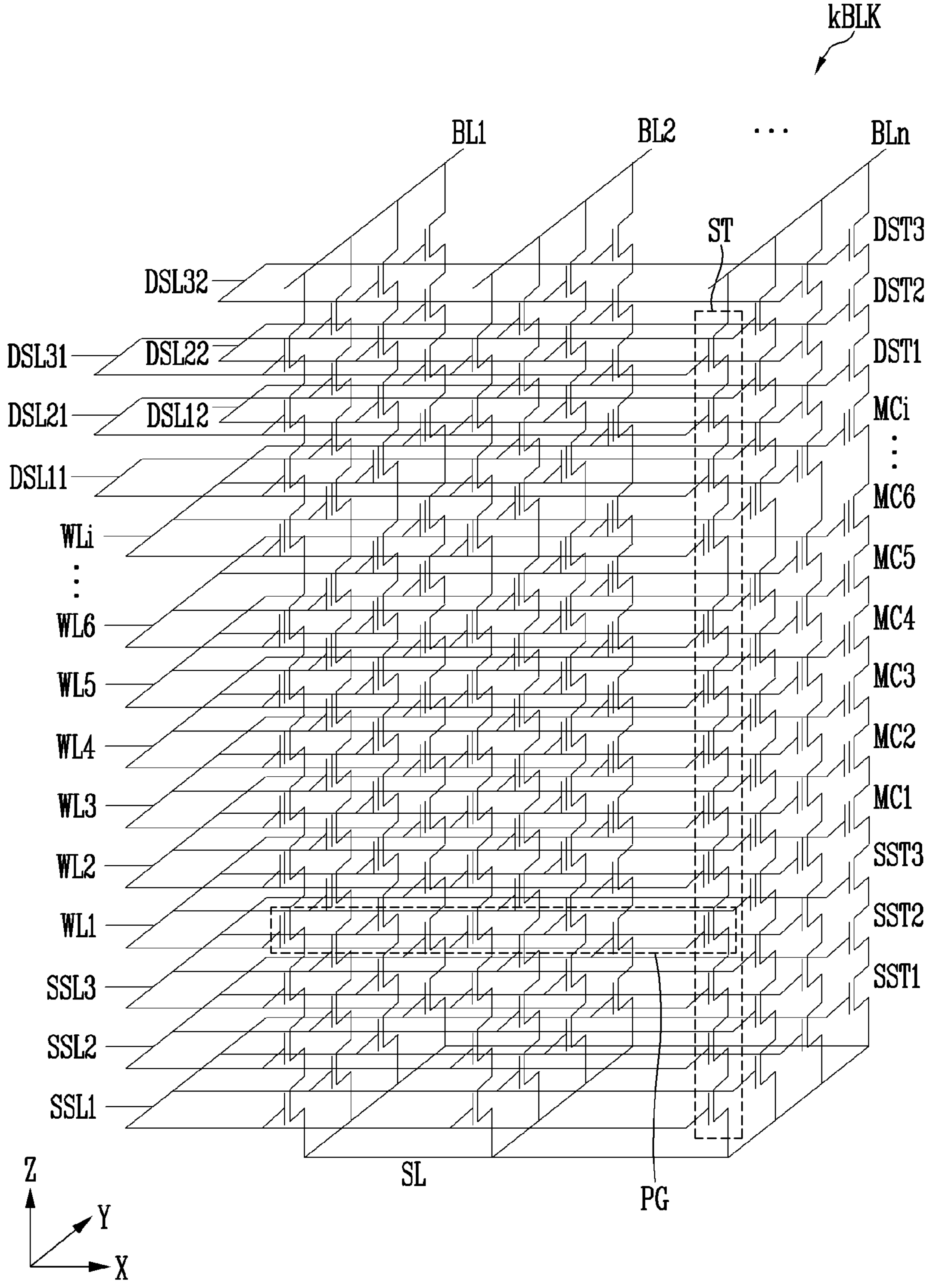
FIG. 3 is a circuit diagram illustrating a memory block in accordance with an embodiment of the present disclosure.

FIG. 3 is a circuit diagram illustrating a memory block in accordance with an embodiment of the present disclosure.

Referring to FIG. 3, the first to kth memory blocks (1BLK to kBLK, which are shown in FIG. 2) are configured identically to one another, and therefore, the kth memory block kBLK is illustrated as an example.

The kth memory block kBLK may include strings ST connected between the first to nth bit lines BL1 to BLn and the source structure SL. Since the first to nth bit lines BL1 to BLn extend along the second direction (Y direction) and are arranged to be spaced apart from each other along the first direction (X direction), the strings ST may also be arranged to be spaced apart from each other along the first and second directions (X and Y directions). For example, strings ST may be connected between the first bit line BL1 and the source structure SL, and strings ST may be arranged between the second bit line BL2 and the source structure SL. In this manner, strings ST may be arranged between the nth bit line BLn and the source structure SL. The strings ST may extend along the third direction (Z direction).

Any one string ST among the strings ST connected to the nth bit line BLn will be described as an example. The string ST may include first to third source select transistors SST1 to SST3, first to ith memory cells MC1 to MCi, and first to third drain select transistors DST1 to DST3. The kth memory block kBLK shown in FIG. 3 is a drawing for understanding the structure of a memory block, and therefore, the numbers of source select transistors, memory cells, and drain select transistors, which are included in the strings ST, may be changed according to a memory device.

Gates of first to third source select transistors SST1 to SST3 included in different strings may be connected to first to third source select lines SSL1 to SSD, gates of first to ith memory cells MC1 to MCi, which are included in different strings, may be connected to first to ith word lines WL1 to WLi, and gates of first to third drain select transistors DST1 to DST3, which are included in different strings, may be connected to eleventh, twelfth, twenty-first, twenty-second, thirty-first, and thirty-second drain select lines DSL11, DSL12, DSL21, DSL22, DSL31, and DSL32.

For example, the first source select line SSL1 may be commonly connected to first source select transistors SST1 arranged at the same distance from the substrate. In other words, first source select transistors SST1 formed in the same layer may be commonly connected to the first source select line SSL1. In this manner, second source select transistors SST2 formed in a layer different from the layer in which the first source select transistors SST1 are formed may be commonly connected to the second source select line SSL2, and third source select transistors SST3 formed in a layer different from the layer in which the second source select transistors SST2 are formed may be commonly connected to the third source select line SSL3. The first to third source select lines SSL1 to SSL3 may be respectively formed in different layers.

In the manner described above, ith memory cells MCi formed in the same layer may be commonly connected to the ith word line WLi, and the first to ith word lines WL1 to WLi may be respectively formed in different layers. A group of memory cells which are included in different strings ST and are connected to the same word line becomes a page PG.

First to third drain select transistors DST1 to DST3 included in different strings ST may be connected to drain select lines isolated from each other. Specifically, each of first to third drain select transistors DST1 to DST3 arranged along the first direction (X direction) may be connected to the same drain select line, and first to third drain select transistors DST1 to DST3 arranged along the second direction (Y direction) may be connected to drain select lines isolated from each other. For example, some of the first drain select transistors DST may be connected to the eleventh drain select line DSL11, and the other of the first drain select transistors DST may be connected to the twelfth drain select line DSL12. The twelfth drain select line DSL12 is a line isolated from the eleventh drain select line DSL11. Therefore, a voltage applied to the eleventh drain select line DSL11 may be different from a voltage applied to the twelfth drain select line DSL12. In this manner, some of the second drain select transistors DST2 may be connected to the twenty-first drain select line DSL21, and the other of the second drain select transistors DST2 may be connected to the twenty-second drain select line DSL22. Some of the third drain select transistors DST3 may be connected to a thirty-first drain select line DSL31, and the other of the third drain select transistors DST3 may be connected to the thirty-second drain select line DSL32.

Although not shown in FIG. 3, dummy lines may be disposed between a drain select line and a word line, and dummy lines may also be disposed between a source select line and a word line.

Figure 4:
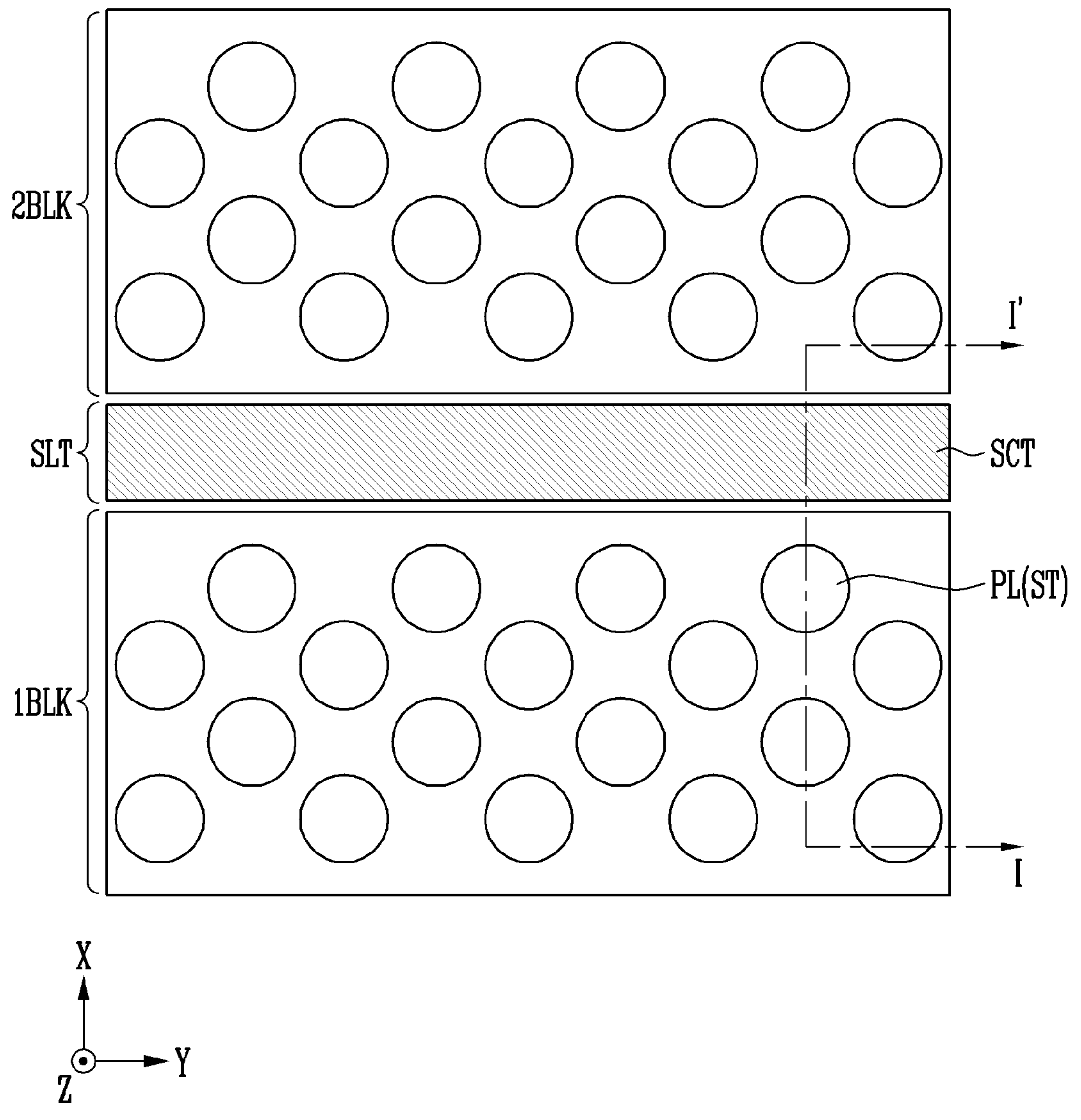
FIG. 4 is a plan view illustrating a structure of a memory device in accordance with an embodiment of the present disclosure.

FIG. 4 is a plan view illustrating a structure of a memory device in accordance with an embodiment of the present disclosure.

Referring to FIG. 4, first and second memory blocks 1BLK and 2BLK may be formed on a plane in first and second directions X and Y. The first and second memory blocks 1BLK and 2BLK may be distinguished from each other by a slit SLT. When the slit SLT extends in the first direction X, the first and second memory blocks 1BLK and 2BLK may be disposed to be distinguished from each other along the second direction Y. FIG. 4 shows, as an embodiment, a region in which the first and second memory blocks 1BLK and 2BLK among the first to kth memory blocks 1BLK to kBLK included in the memory cell array 110 shown in FIG. 2 are formed, is distinguished from each other by the slit SLT, and therefore, the other second to kth memory blocks 2BLK to kBLK may also be distinguished from each other by the slit SLT. The region in which the first and second memory blocks 1BLK and 2BLK are formed in a region in which the first to kth memory blocks 1BLK to kBLK are formed will be described, for example, as follows.

A plurality of plugs PL may be included in the first and second memory blocks 1BLK and 2BLK. Each of the plugs PL may correspond to the string ST described in FIG. 3. For example, the plugs PL may be arranged to be spaced apart from each other along the first or second direction X or Y, and extend along a third direction Z vertical to a substrate. Since gate lines of memory cells formed on the same plane among a plurality of memory cells included in the same memory block are connected to each other, gate lines of different memory blocks formed on the same plane may be isolated from each other by the slit SLT.

The slit SLT may be filled with an insulating material, but a source contact SCT may be formed in the slit SLT to decrease the size of the memory device. The source contact SCT transfers a source voltage supplied through a line formed above the first and second memory blocks 1BLK and 2BLK to a source structure formed under the first and second memory blocks 1BLK and 2BLK. The source structure is commonly connected to a plurality of memory blocks, and hence an electrical characteristic change of the source structure may have influence on the plurality of memory blocks. In this embodiment, in order to reduce a resistance of a region in which the source contact SCT and the source structure are in contact with each other, a compensation layer into which an impurity is implanted may be formed in the source structure. The compensation layer may be formed by performing an ion implantation process. A memory device including a compensation layer and a manufacturing method of the memory device will be described in detail as follows.

Figure 5:
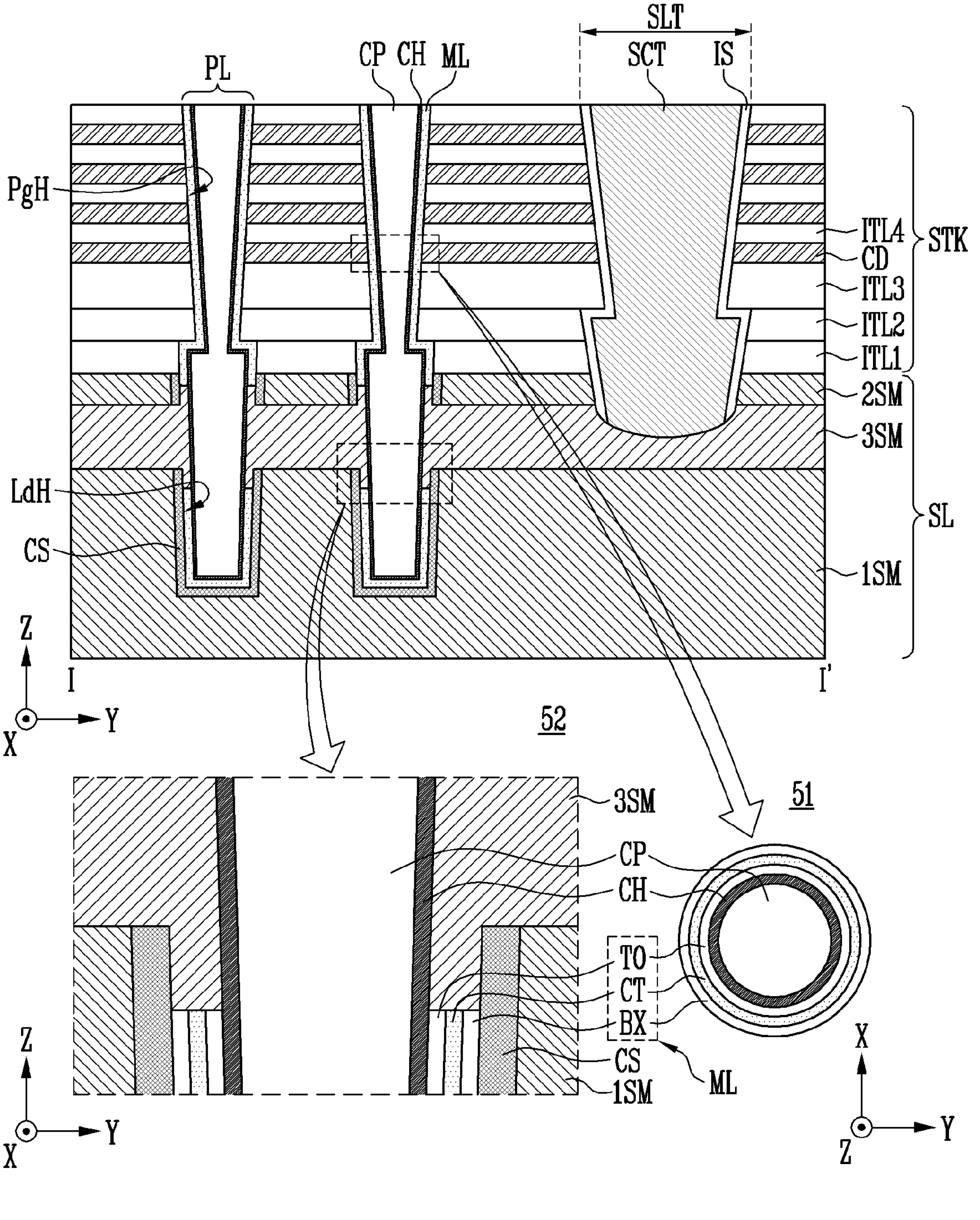
FIG. 5 is a sectional view illustrating a structure of a memory device in accordance with an embodiment of the present disclosure.

FIG. 5 is a sectional view illustrating a structure of a memory device in accordance with an embodiment of the present disclosure.

Referring to FIG. 5, the memory device may include a source structure SL, a stack structure STK, plugs PL, compensation layers CS, and a source contact SCT, which are formed on a lower structure (not shown).

Although not shown in the drawing, the lower structure may be a substrate or a peripheral circuit structure.

The source structure SL may include first source layer 1SM, a third source layer 3SM, and a second source layer 2SM, which are stacked. For example, the third source layer 3SM may be formed on the top of the first source layer 1SM, and the second source layer 2SM may be formed on the top of the third source layer 3SM. The first, third, and second source layers 1SM, 3SM, and 2SM may be formed of a conductive material. For example, the first, third, and second source layers 1SM, 3SM, and 2SM may be formed of a conductive material such as poly-silicon, tungsten, or nickel. In addition, various kinds of conductive materials may be used.

The stack structure STK may include first to third interlayer insulating layers ITL1 to ITL3 stacked on the source structure SL, and conductive layers CD and fourth interlayer insulating layers ITL4, which are alternately stacked. The first to fourth interlayer insulating layers ITL1 to ITL4 may be formed with an oxide layer or a silicon oxide layer. The conductive layers CD may be formed of a conductive material used for gate lines. For example, the conductive layers CD may be formed of a metal material such as tungsten (W), molybdenum (Mo), cobalt (Co) or nickel (Ni), or a semiconductor material such as silicon (Si) or poly-silicon (Poly-Si), but the present disclosure is not limited thereto.

The plugs PL may protrude even to a portion of the source structure SL while penetrating the stack structure STK. For example, the plugs PL may penetrate the stack structure STK along the third direction Z, and lower portions of the plugs PL may protrude to the inside of the source structure SL. The plugs PL may be formed inside landing holes LdH formed in the source structure SL and plug holes PgH formed in the stack structure STK. Upper regions of the landing holes LdH may overlap with a lower region of the stack structure STK. Each of the plugs PL may include a memory layer ML, a channel layer CH, and a core pillar CP, which are formed inside the landing hole LdH and the plug hole PgH. For example, the memory layer ML may be formed in a cylindrical shape along inner walls of the landing hole LdH and the plug hole PgH, and the channel layer CH may be formed in a cylindrical shape along an inner wall of the memory layer ML. The core pillar CP may be formed in a cylindrical shape along an inner wall of the channel layer CH.

A portion 51 of the memory layer ML, which is formed in the same layer as each of the conductive layers CD, may become a memory cell. The memory cell with a planar structure in an X-Y direction will be described as follows. The memory cell may include a core pillar CP having a cylindrical shape, and include a channel layer CH surrounding a side surface of the core pillar CP, a tunnel insulating layer TO surrounding a side surface of the channel layer CH, a charge trap layer CT surrounding a side surface of the tunnel insulating layer TO, and a blocking layer BX surrounding a side surface of the charge trap layer CT. The tunnel insulating layer TO, the charge trap layer CT, and the blocking layer BX, which surround the channel layer CH, may be included in the memory layer ML.

The channel layers CH included in the plugs PL extend in the plug holes PgH and the landing holes LdH, but portions of the memory layers ML may be removed in the landing holes LdH. The channel layers CH are in contact with the source structure SL in regions in which the portions of the memory layers ML are removed.

The compensation layers CS may be formed at portions of regions in which the plugs PL and the source structure SL are in contact with each other. For example, the compensation layers CS may be formed in the first and second source layers 1SM and 2SM included in the source structure SL. Specifically, the compensation layers CS may be formed in regions in contact with the plugs PL in the first and second source layers 1SM and 2SM. Therefore, the third source layer 3SM formed between the first and second source layers 1SM and 2SM may be in contact with the channel layers CH included in the plugs PL, and the compensation layers CS may be formed between the first and second source layers 1SM and 2SM and the plugs PL.

Referring to an enlarged view (52) of a partial region in which the compensation layer CS is formed, the compensation layer CS may be formed between a first source layer 1SM and the plug PL. The channel layer CH included in the plug PL extends in the third direction Z, but a portion of the memory layer ML surrounding the periphery of the channel layer CH may be removed. An uppermost end of the memory layer ML between the compensation layer CS and the channel layer CH may be located lower than an uppermost end of the compensation layer CS. A lowermost end of the memory layer ML may be located higher than a lowermost end of the compensation layer CS in a region in which the second source layer 2SM is formed. In an embodiment, as shown for example in FIG. 5, the core pillar CP and the channel layer CH extend from an uppermost end to a lowermost end of the plug PL in the Z direction.

The compensation layer CS, in an embodiment, is a layer for reducing a resistance between the plug PL and the source structure SL, and may be formed by performing an ion implantation process. For example, in a manufacturing process of the memory device, i.e., an etching or cleaning process for forming the landing hole LdH in the first and second source layers 1SM and 2SM, surfaces of the first and second source layers 1SM and 2SM, which are exposed through the landing hole LdH, may be physically damaged. This physical damage may increase as a concentration of an impurity contained in the first and second source layers 1SM and 2SM becomes higher. When the concentration of the impurity contained in the first and second source layers 1SM and 2SM is lowered, in an embodiment, to reduce the physical damage of the first and second source layers 1SM and 2SM in the manufacturing process, an electrical characteristic of the source structure SL may be deteriorated. Therefore, in this embodiment, the compensation layer CS having a high concentration of the impurity may be formed in partial regions in which the source structure SL and the plugs PL are in contact with each to prevent or mitigate physical damage of the source structure SL and to prevent or mitigate deterioration of an electrical characteristic of the source structure SL. For example, the compensation layer CS may be formed to have a concentration higher than the concentration of the impurity contained in the first and second source layers 1SM and 2SM constituting the source structure SL.

The compensation layer CS may be formed through a process of implanting an impurity into the first and second source layers 1SM and 2SM. For example, an impurity implanted into the compensation layer CS may be the same ion as the impurity contained in the first to third source layers 1SM to 3SM, or be an ion capable of reducing a resistance of the source structure SL. For example, the impurity contained in the compensation layer CS may be a phosphorous or boron ion. However, various ions capable of improving an electrical characteristic of the source structure SL may be used in addition to the phosphorous or boron ion.

The source contact SCT may protrude even to a portion of the source structure SL while penetrating the stack structure STK. For example, the source contact SCT may penetrate the stack structure STK along the third direction Z, and a lower portion of the source contact SCT may protrude to the inside of the source structure SL. The source contact SCT may be formed in a slit SLT for isolating the conductive layers CD included in the stack structure STK from each other. For example, the slit SLT may be a trench which isolates the conductive layers CD and the fourth interlayer insulating layers ITL4, which are included in the stack structure STK, from each other in the first direction X. The slit SLT may be formed to expose a portion of the source structure SL. The conductive layers CD may be exposed through a side surface of the slit SLT, and hence an insulating layer IS may be formed on the side surface of the slit SLT. Therefore, the source contact SCT made of a conductive material may be formed inside the slit SLT in which the insulating layer IS is formed. The source contact SCT is not in contact with the conductive layers CD of the stack structure STK but is in contact with the source structure SL. The source contact SCT may be formed of a conductive material. For example, the source contact SCT may be formed of a conductive material such as poly-silicon or tungsten.

A manufacturing method of the above-described memory device will be described in detail as follows.

Figure 6A:
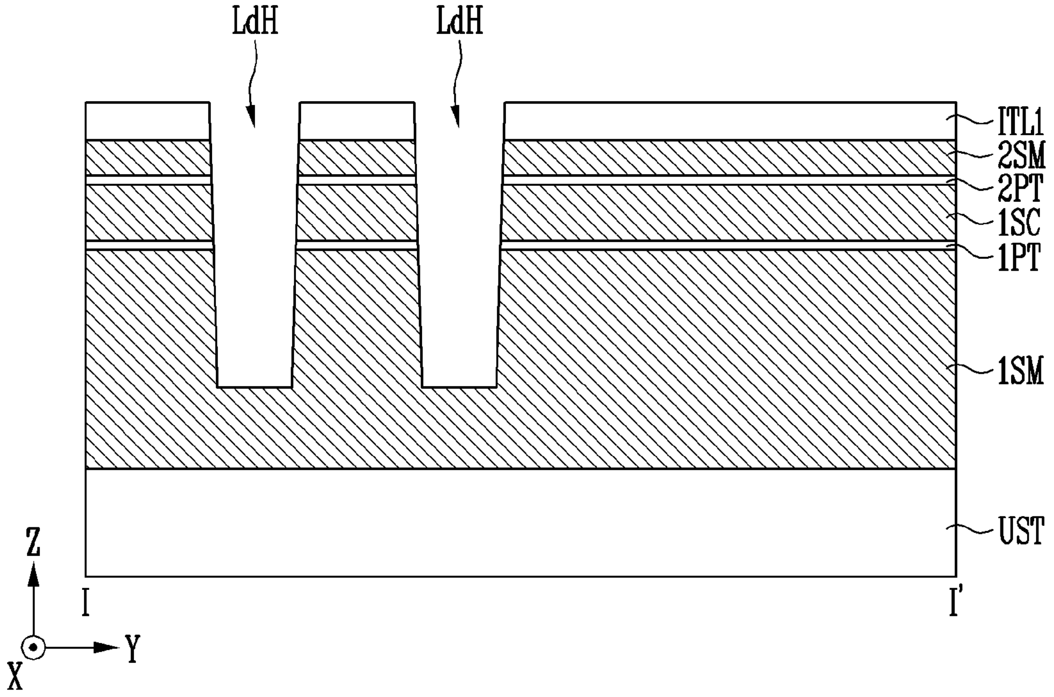
Figure 6B:
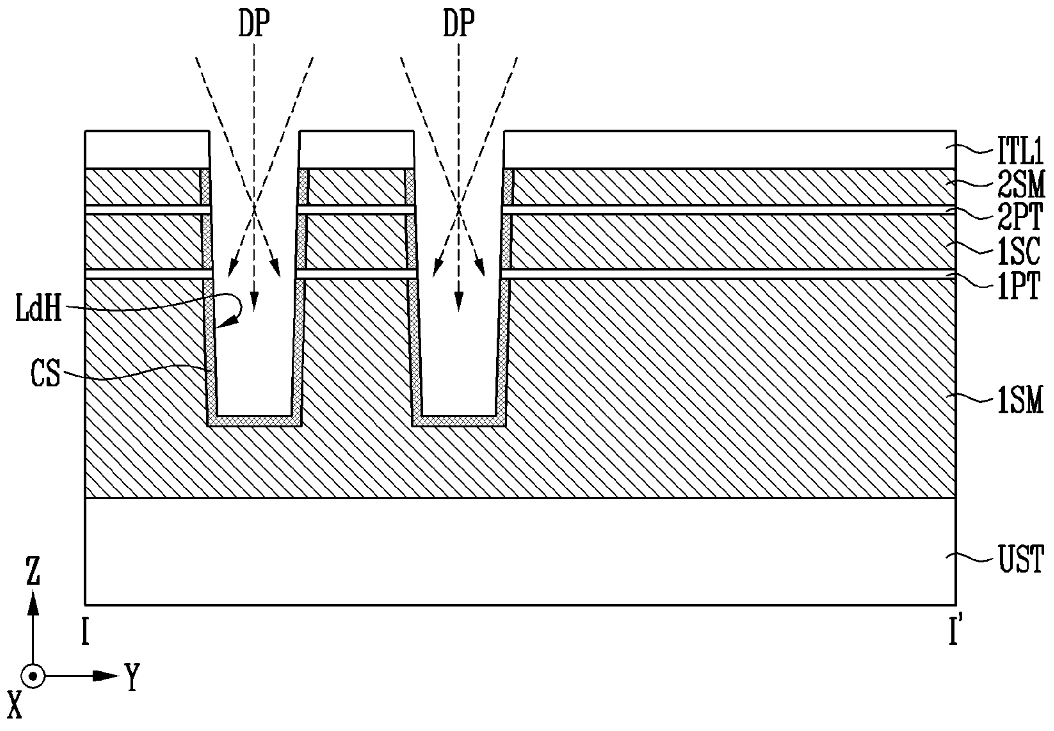
Figure 6C:
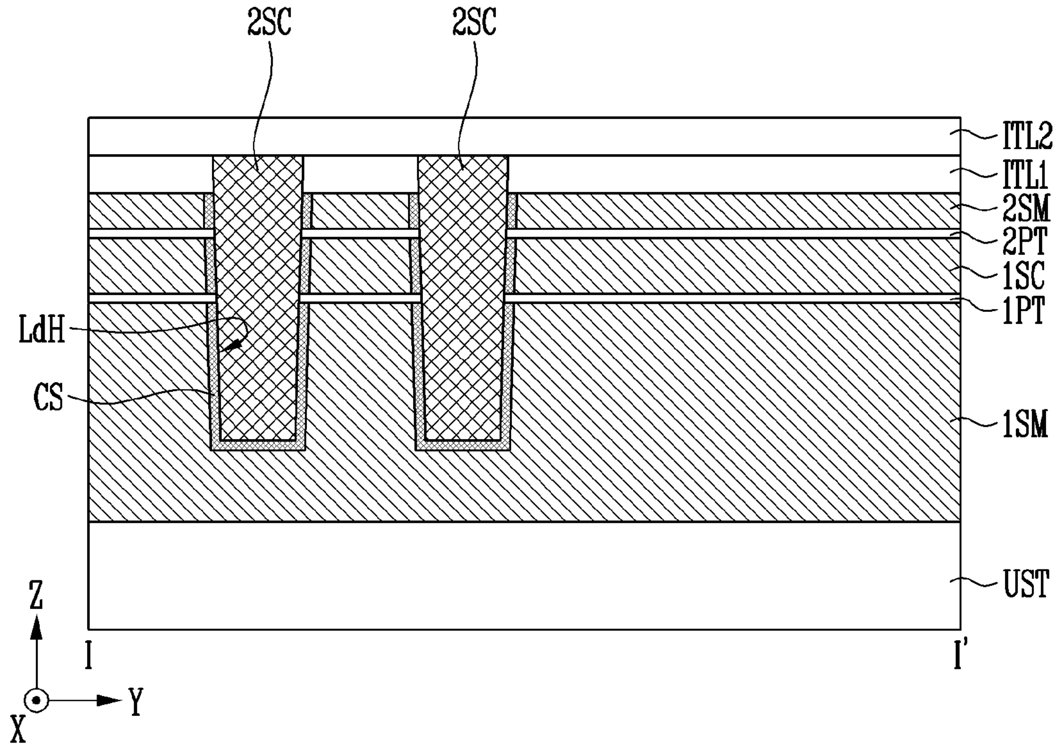
Figure 6D:
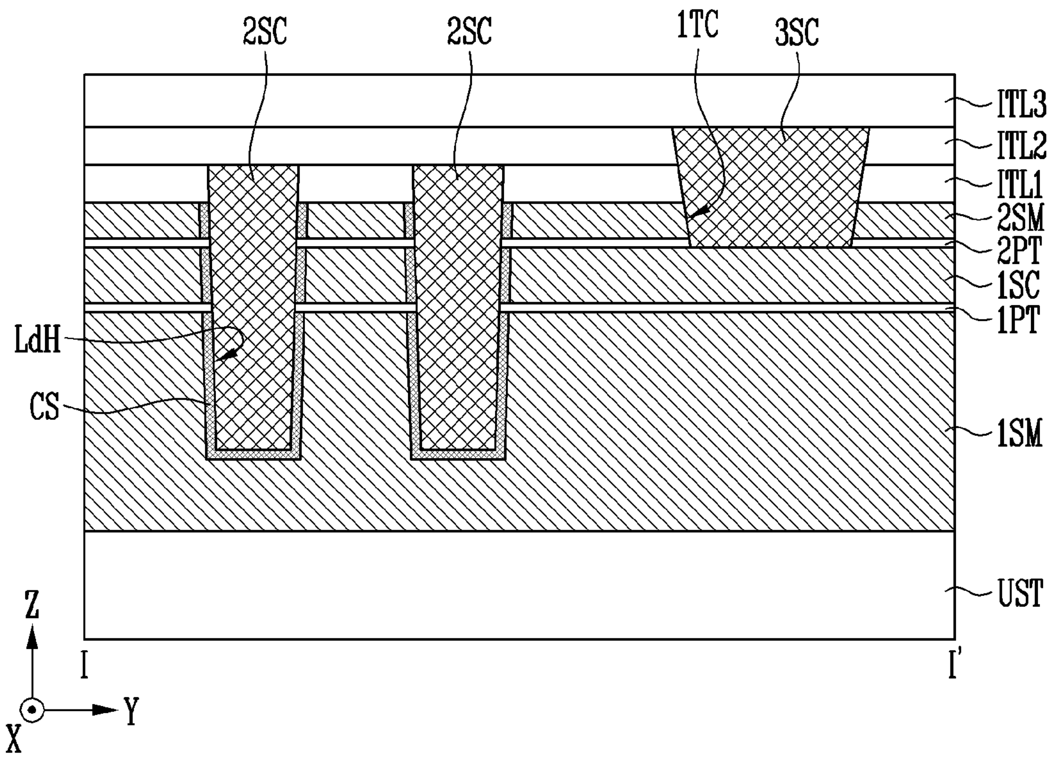
Figure 6E:
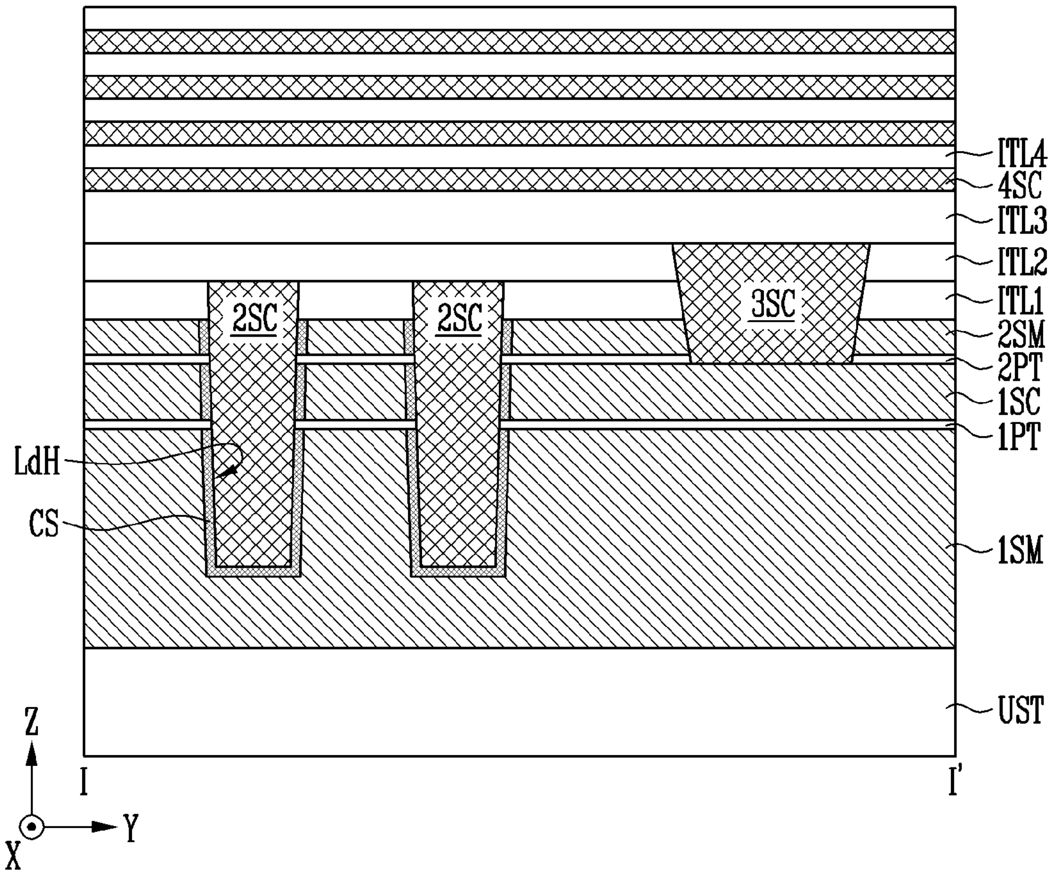
Figure 6F:
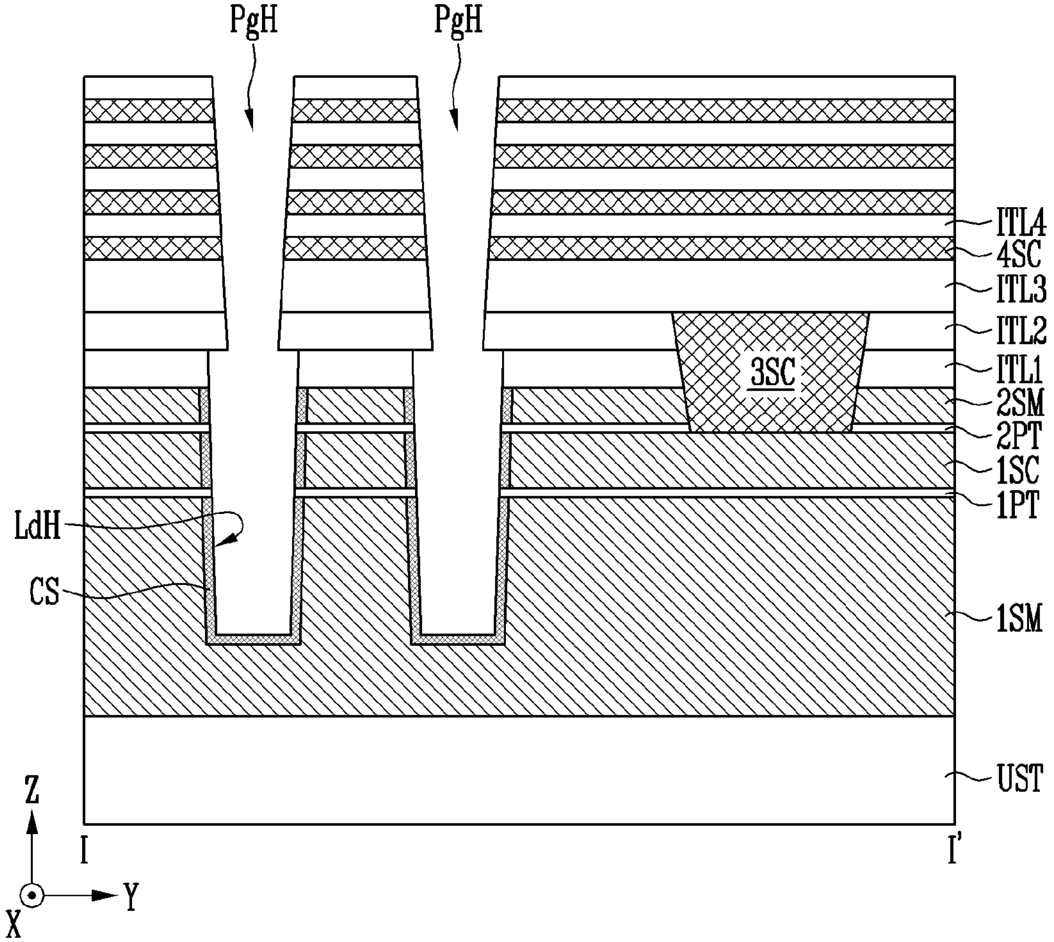
Figure 6G:
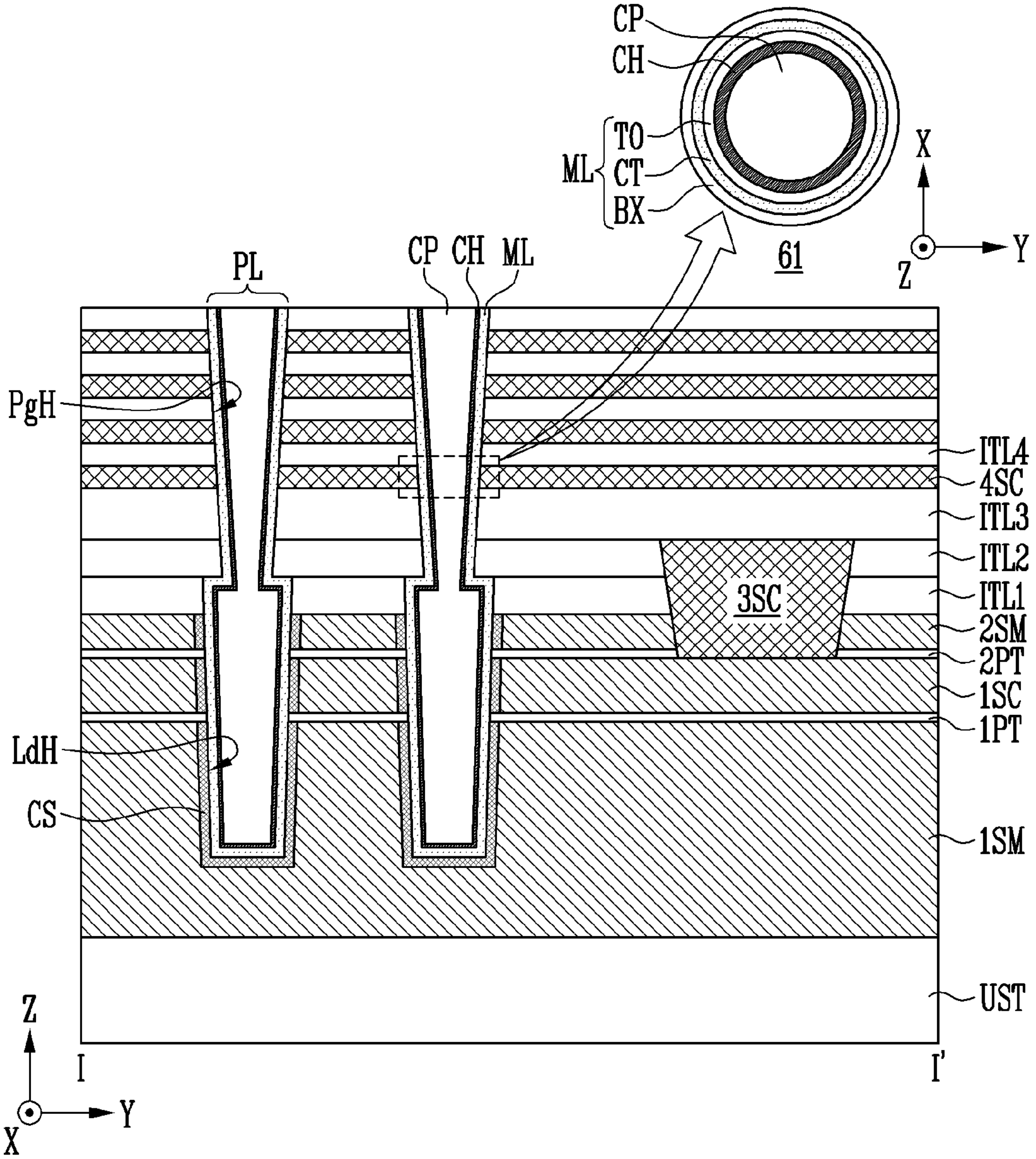
Figure 6H:
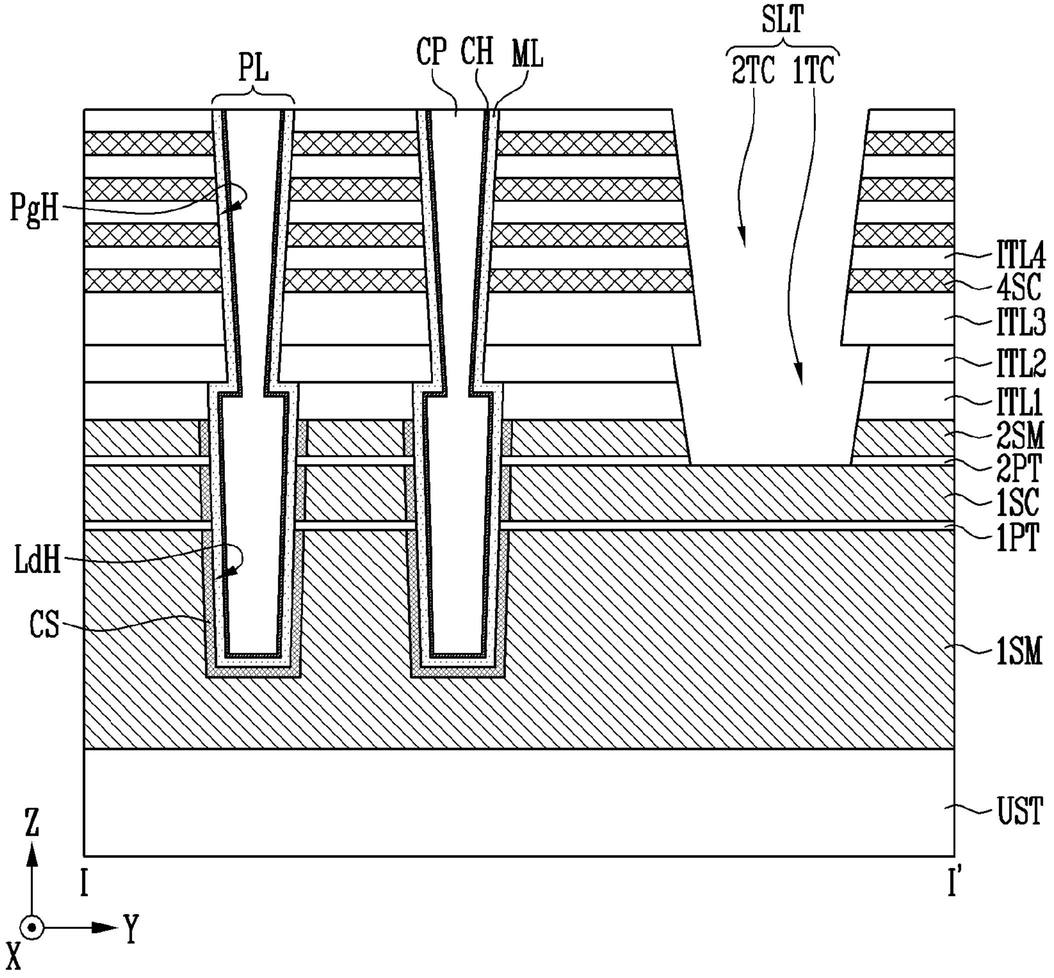
Figure 6I:
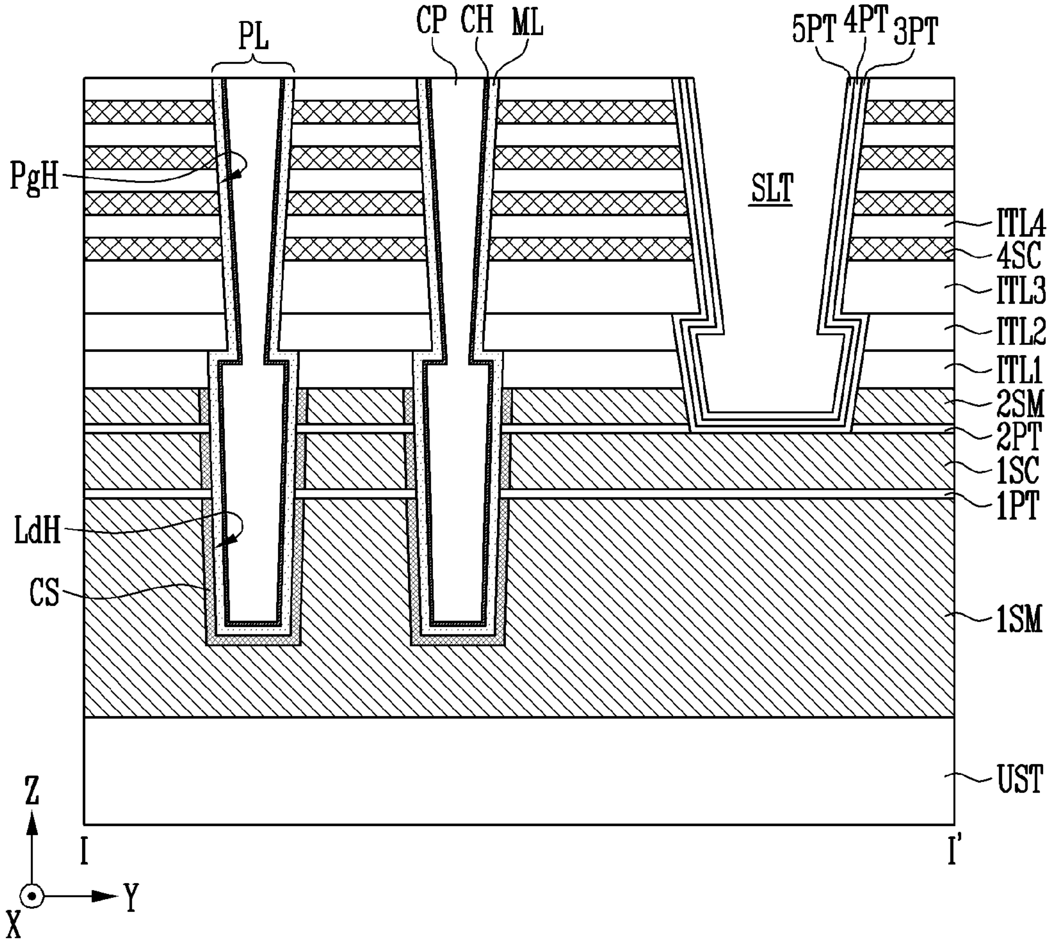
Figure 6J:
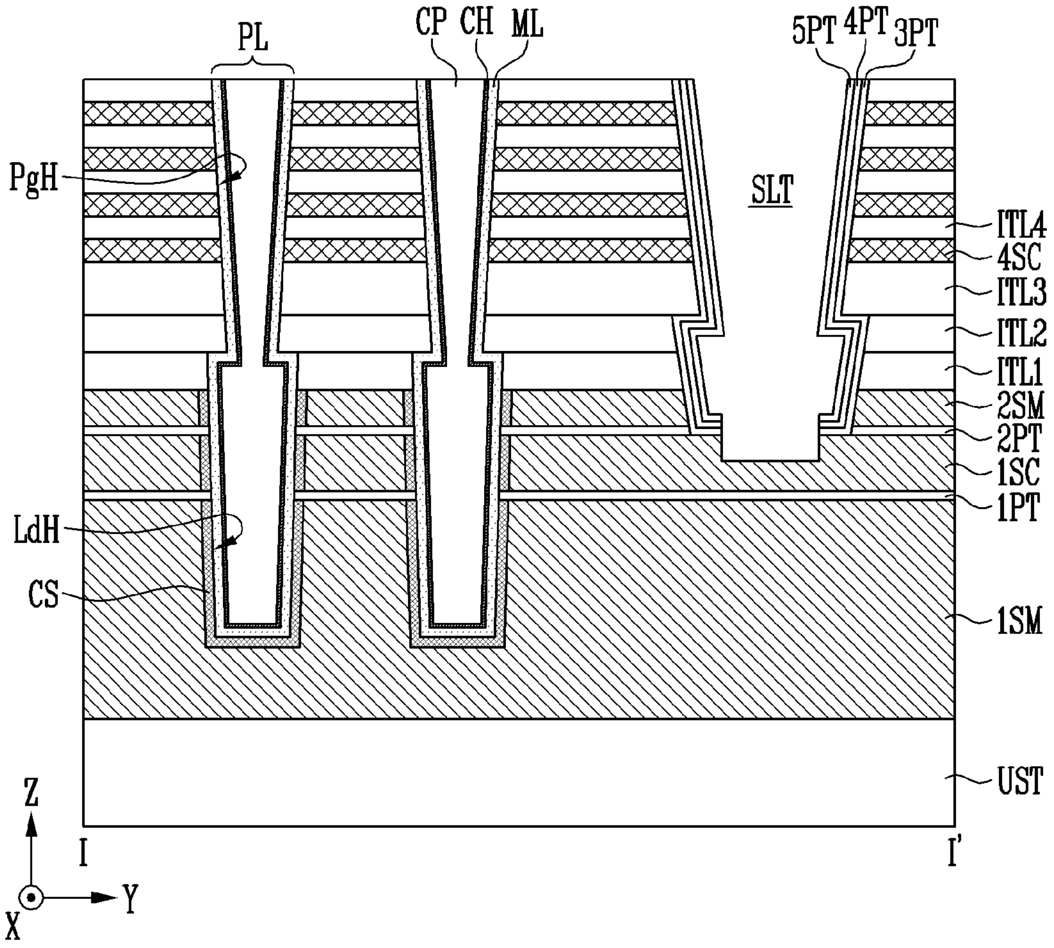
Figure 6K:
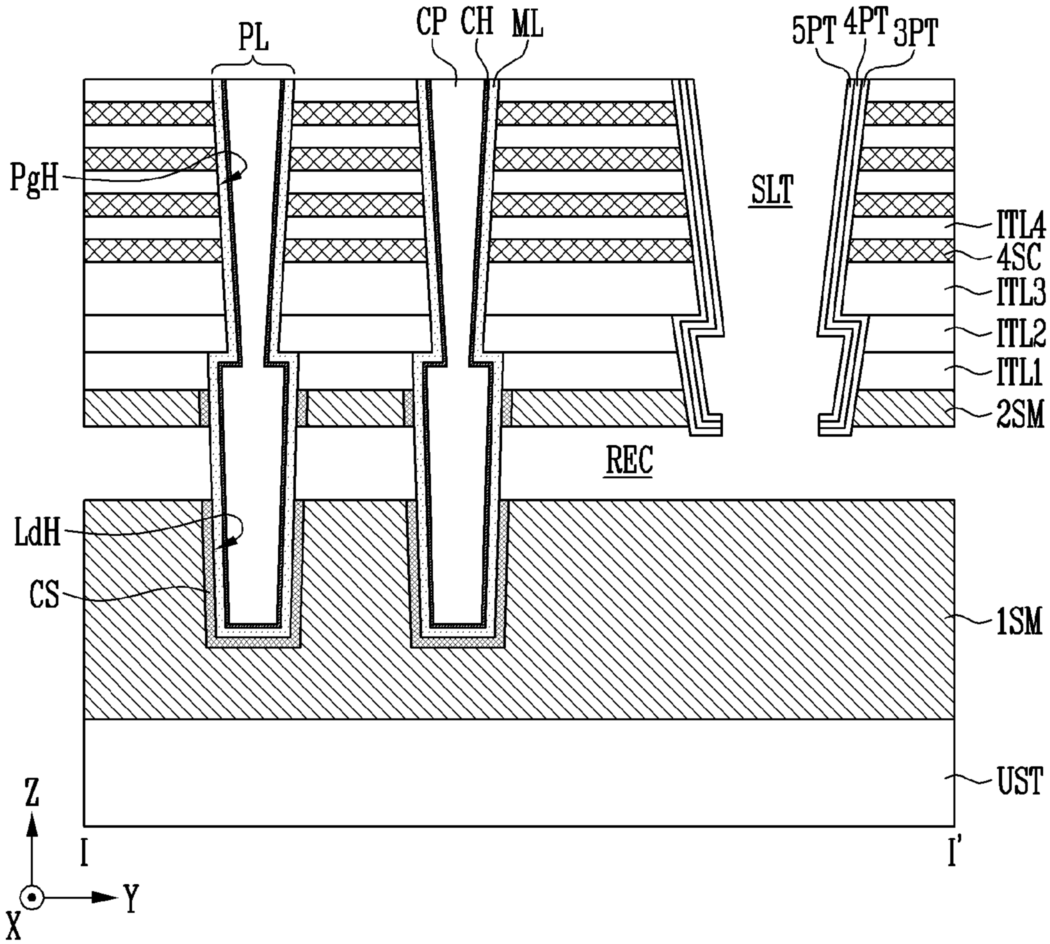
Figure 6L:
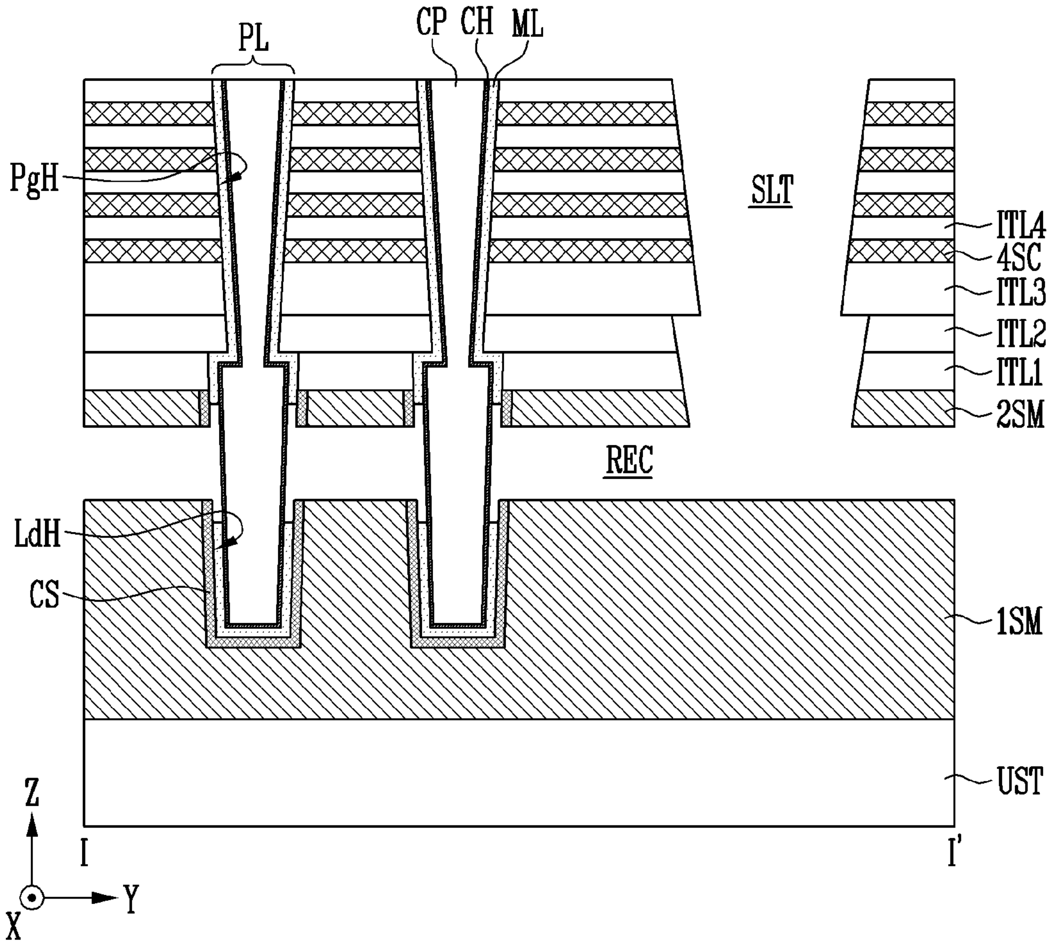
Figure 6M:
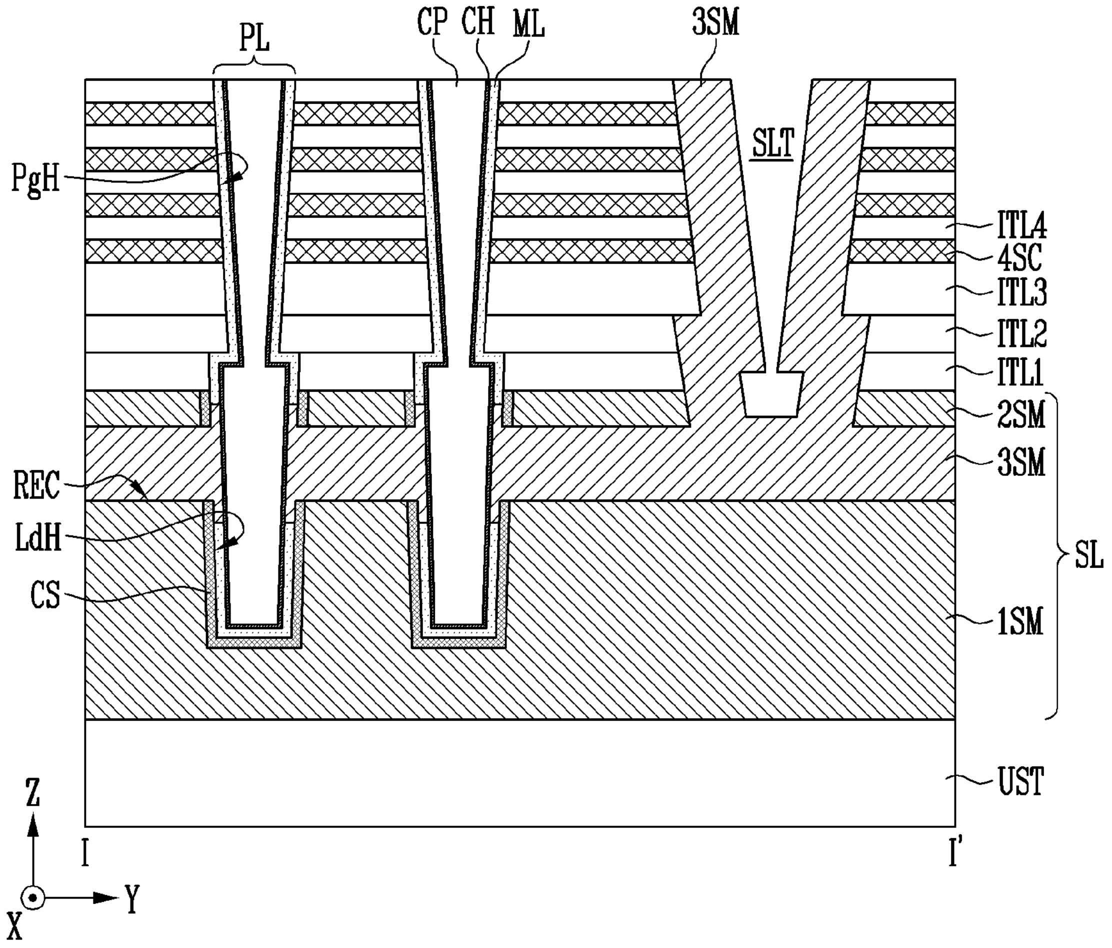
Figure 6N:
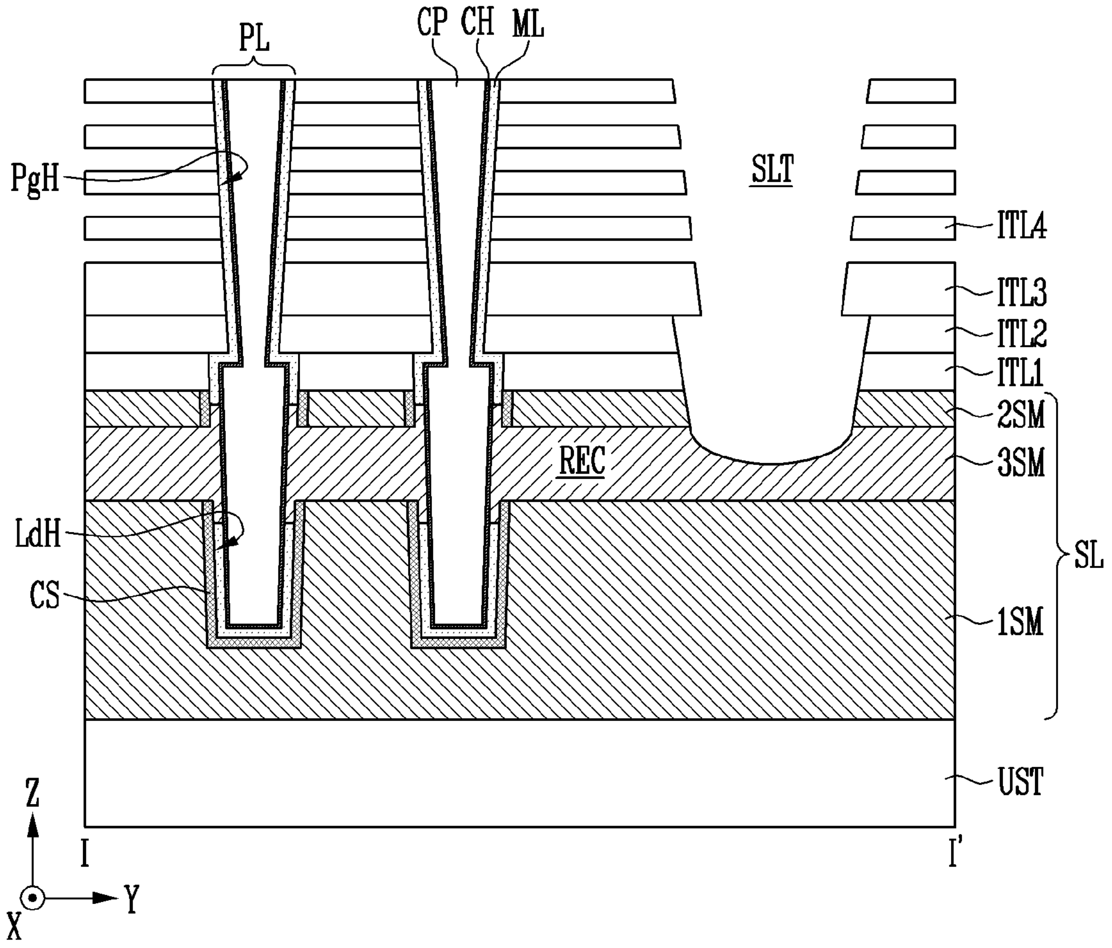
Figure 60:
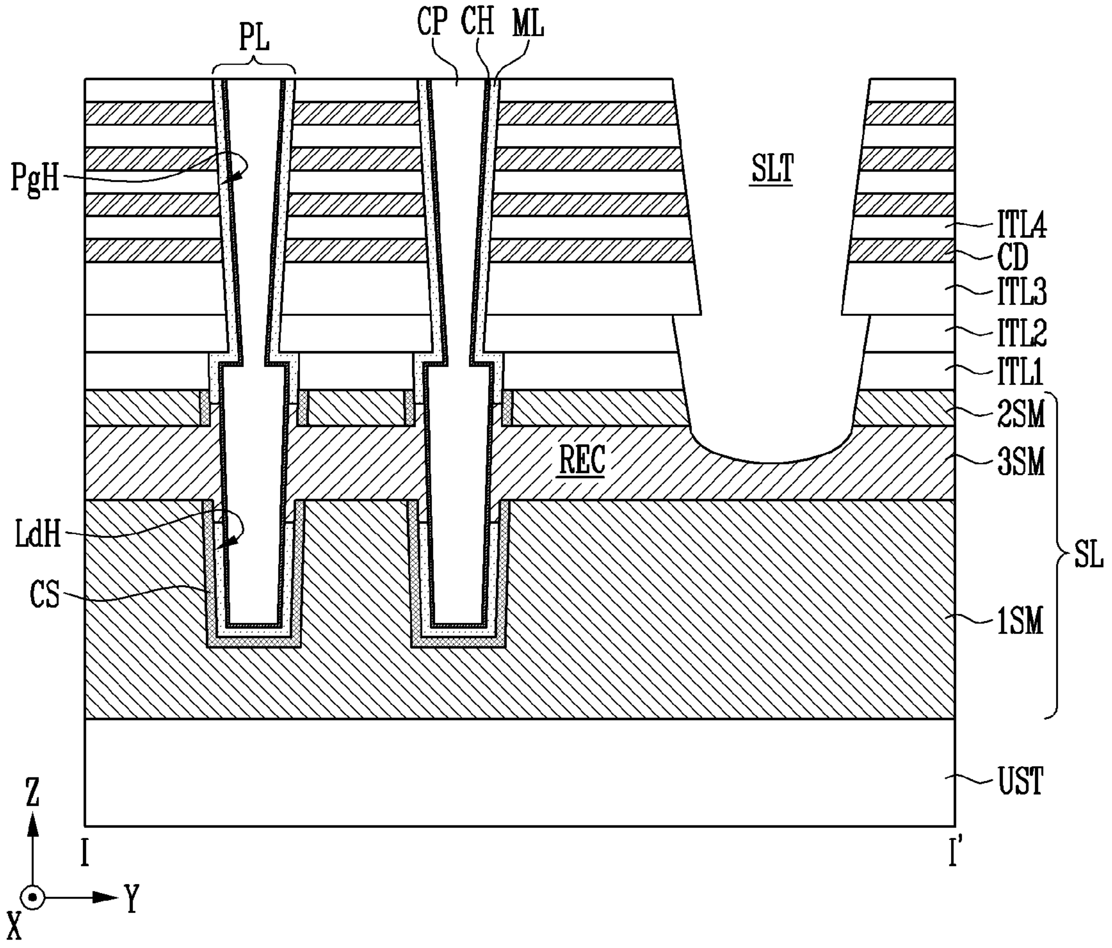
Figure 6P:
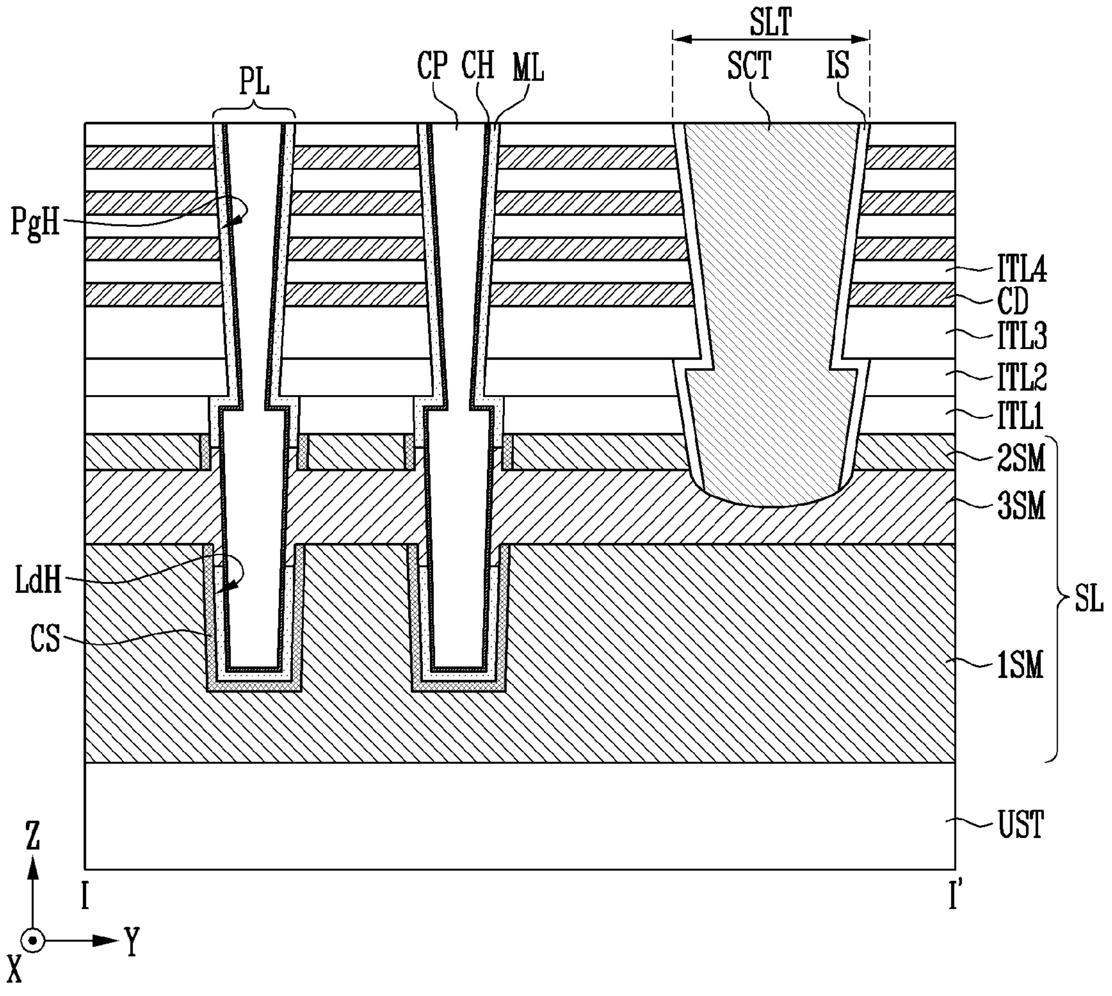

FIGS. 6A to 6P are views illustrating a manufacturing method of the memory device in accordance with an embodiment of the present disclosure.

Referring to FIG. 6A, a first source layer 1SM, a first protective layer 1PT, a first sacrificial layer 1SC, a second protective layer 2PT, a second source layer 2SM, and a first interlayer insulating layer ITL1 may be stacked on the top of a lower structure UST. The lower structure UST may be a substrate or a peripheral circuit structure. The peripheral circuit structure may include transistors and lines, which are configured to perform a program, read or erase operation. The first source layer 1SM is a conductive layer to be used for a source structure, and may be formed poly-silicon containing an impurity. The first protective layer 1PT may be formed on the top of the first source layer 1SM, and be used as a layer for protecting a surface of the first source layer 1SM in a subsequent etching process. The first protective layer 1PT may be formed of a material having an etch selectivity different from an etch selectivity of the first source layer 1SM. For example, the first protective layer 1PT may be formed as an oxide layer or a silicon oxide layer. The first sacrificial layer 1SC may be formed of a material removed in a subsequent process, and be formed on the top of the first protective layer 1PT. The first sacrificial layer 1SC may be formed of a material having an etch selectivity different from the etch selectivity of the first protective layer 1PT. For example, the first sacrificial layer 1SC may be formed of the same material as the first source layer 1SM. The second protective layer 2PT is a layer for protecting the second source layer 2SM in a process of removing the first sacrificial layer 1SC, and may be formed on the top of the first sacrificial layer 1SC. For example, the second protective layer 2PT may be formed of a material having an etch selectivity different from an etch selectivity of the second source layer 2SM. For example, the second protective layer 2PT may be formed of the same material as the first protective layer 1PT. The second source layer 2SM is a conductive layer to be used for the source structure, and may be formed of poly-silicon containing the impurity. The first interlayer insulating layer ITL1 may be formed as an oxide layer or a silicon oxide layer. After the first source layer 1SM, the first protective layer 1PT, the first sacrificial layer 1SC, the second protective layer 2PT, the second source layer 2SM, and the first interlayer insulating layer ITL1 are stacked on the top of the lower structure UST, landing holes LdH may be formed, which penetrate the first interlayer insulating layer ITL1, the second source layer 2SM, the second protective layer 2PT, the first sacrificial layer 1SC, the first protective layer 1PT, and the first source layer 1SM. For example, the landing holes LdH may penetrate the first interlayer insulating layer ITL1, the second source layer 2SM, the second protective layer 2PT, the first sacrificial layer 1SC, and the first protective layer 1PT in a vertical direction, and be formed such that lowermost ends of the landing holes LdH are located in the first source layer 1SM. That is, an etching process for forming the landing holes LdH may be stopped before the lower structure UST is exposed.

Referring to FIG. 6B, an ion implantation process for forming a compensation layer CS may be performed on the first source layer 1SM, the first sacrificial layer 1SC, and the second source layer 2SM, which are exposed through the inside of the landing holes LdH. For example, in the etching process for forming the landing holes LdH, etched surfaces of the first source layer 1SM, the first sacrificial layer 1SC, and the second source layer 2SM may be damaged. In order to suppress physical damage which may occur in the etching process, a concentration of the impurity contained in the first source layer 1SM, the first sacrificial layer 1SC, and the second source layer 2SM may be lowered when the first source layer 1SM, the first sacrificial layer 1SC, and the second source layer 2SM are formed (FIG. 6A). When the concentration of the impurity is lowered, an electrical characteristic of the source structure may be deteriorated. Therefore, in this embodiment, the compensation layer CS may be formed inside the first source layer 1SM, the first sacrificial layer 1SC, and the second source layer 2SM, which are exposed through the landing holes LdH, by implanting an impurity DP into the first source layer 1SM, the first sacrificial layer 1SC, and the second source layer 2SM, which are exposed through the landing holes LdH. The ion implantation process may be performed in a tilting manner (i.e., tilting ion implantation process) such that, for example, the impurity DP can be uniformly implanted into the surfaces of the first source layer 1SM, the first sacrificial layer 1SC, and the second source layer 2SM, which are exposed through the landing holes LdH. For example, in the ion implantation process performed in the tilting manner, an incident angle of the impurity DP may form 90 degrees or an angle smaller than 90 degrees. The impurity DP implanted in the ion implantation process may be a phosphorous or boron ion. However, various ions capable of improving an electrical characteristic of the source structure may be used in addition to the phosphorous or boron ion. In an embodiment, the compensation layer CS may be formed by a tilting ion implantation process of changing an incident angle of the impurity.

After the ion implantation process is performed, a heat treatment process may be further performed to diffuse the impurity DP implanted into the first source layer 1SM, the first sacrificial layer 1SC, and the second source layer 2SM.

Referring to FIG. 6C, a second sacrificial layer 2SC may be filled inside the landing holes LdH, and a second interlayer insulating layer ITL2 may be formed on the entire structure including the second sacrificial layer 2SC. For example, the second sacrificial layer 2SC may be formed on the landing holes LdH and the first interlayer insulating layer ITL1 such that the inside of the landing holes LdH is sufficiently filled. The second sacrificial layer 2SC may be formed of any one material among titanium nitride (TiN), tungsten (W), and carbon (C), or be formed of a mixture thereof. When the second sacrificial layer 2SC is formed of a mixture in which at least two materials among titanium nitride (TiN), tungsten (W), and carbon (C) are mixed, a plurality of layers made of different materials may be alternately stacked. For example, when the second sacrificial layer 2SC is formed of titanium nitride (TiN) and tungsten (W), a plurality of stacked layers including titanium nitride (TiN) and tungsten (W) may be formed as the second sacrificial layer 2SC inside the landing holes LdH. Subsequently, a planarization process may be performed such that the first interlayer insulating layer ITL1 is exposed. The second sacrificial layer 2SC may be formed of a material having an etch selectivity different from the etch selectivity of each of the first source layer 1SM, the first sacrificial layer 1SC, and the second source layer 2SM. After the planarization process is performed, the second interlayer insulating layer ITL2 formed on the entire structure may be formed as an oxide layer or a silicon oxide layer.

Referring to FIG. 6D, a first trench 1TC may be formed by etching portions of the second and first interlayer insulating layers ITL2 and ITL1, the second source layer 2SM, and the second protective layer 2PT, and a third sacrificial layer 3SC may be formed in the first trench 1TC. For example, the first trench 1TC may be formed in the same region as a region in which a slit is to be formed. The third sacrificial layer 3SC may be formed of any one material among titanium nitride (TiN), tungsten (W), and carbon (C), or be formed of a mixture thereof. When the third sacrificial layer 3SC is formed of a mixture in which at least two materials among titanium nitride (TiN), tungsten (W), and carbon (C) are mixed, a plurality of layers made of different materials may be alternately stacked. For example, when the third sacrificial layer 3SC is formed of titanium nitride (TiN) and tungsten (W), a plurality of stacked layers including titanium nitride (TiN) and tungsten (W) may be formed as the third sacrificial layer 3SC inside the first trench 1TC. The etching process for forming the first trench 1TC may be performed until the first sacrificial layer 1SC is exposed. After the third sacrificial layer 3SC is formed in the first trench 1TC, a third interlayer insulating layer ITL3 may be formed on the entire structure. The third interlayer insulating layer ITL3 may be formed as an oxide layer or a silicon oxide layer.

Referring to FIG. 6E, a fourth sacrificial layers 4SC and fourth interlayer insulating layers ITL4 may be alternately stacked on the third interlayer insulating layer ITL3. The fourth sacrificial layers 4SC may be formed of a material having an etch selectivity different from an etch selectivity of the fourth interlayer insulating layers ITL4. For example, each of the fourth sacrificial layers 4SC may be formed as a nitride layer. Each of the fourth interlayer insulating layers ITL4 may be formed as an oxide layer or a silicon oxide layer.

Referring to FIG. 6F, an etching process may be performed such that plug holes PgH are formed on the tops of the landing holes LdH. For example, the plug holes PgH may be formed by etching portions of the fourth sacrificial layers 4SC and the fourth interlayer insulating layers ITL4 such that the second sacrificial layers (2SC shown in FIG. 6E) filled inside the landing holes LdH are exposed, and an etching process for removing the second sacrificial layers 2SC exposed through the plug holes PgH may be performed. Therefore, the plug holes PgH and the landing holes LdH may be connected to each other, and the compensation layer CS may be exposed through the plug holes PgH and the landing holes LdH.

Referring to FIG. 6G, plugs PL may be formed inside the plug holes PgH and the landing holes LdH. Each of the plugs PL may include a memory layer ML, a channel layer CH, and a core pillar CP, which are sequentially formed along surfaces of the plug holes PgH and the landing holes LdH. The memory layer ML may be formed in a cylindrical shape along inner surfaces of the plug holes PgH and the landing holes LdH, the channel layer CH may be formed in a cylindrical shape along an inner surface of the memory layer ML, and the core pillar CP may be formed in a cylindrical shape filling an inner region of the channel layer CH.

A portion of the plug PL, which is formed in the same layer as each of the fourth sacrificial layers 4SC, may become a memory cell 61. An X-Y planar structure of the memory cell 61 will be described as follows. The memory cell 61 may include a core pillar CP formed in a cylindrical shape, and include a channel layer CH surrounding the periphery of the core pillar CP, a tunnel insulating layer TO surrounding the periphery of the channel layer CH, a charge trap layer CT surrounding the periphery of the tunnel insulating layer TO, and a blocking layer BX surrounding the periphery of the charge trap layer CT. The tunnel insulating layer TO, the charge trap layer CT, and the blocking layer BX, which surround the channel layer CH, may be included in the memory layer ML. The blocking layer BX formed in the landing hole LdH may be in contact with the compensation layer CS.

Referring to FIG. 6H, a second trench 2TC may be formed by etching portions of the fourth sacrificial layers 4SC and the fourth interlayer insulating layers ITL4, which are stacked on the top of the third sacrificial layer (3SC shown in FIG. 6G). For example, the etching process forming the second trench 2TC may be performed until the third sacrificial layer 3SC filled in the first trench 1TC is exposed. When the third sacrificial layer 3SC is exposed through the first trench 1TC, an etching process for removing the exposed third sacrificial layer 3SC may be performed. A region in which the third sacrificial layer 3SC is removed becomes the first trench 1TC, and therefore, the first and second trenches 1TC and 2TC may be connected to each other. Since the second trench 2TC may be formed in a shape for distinguishing memory blocks from each other, the first and second trenches 1TC and 2TC may become a slit SLT for distinguishing memory blocks from each other.

Referring to FIG. 6I, third to fifth protective layers 3PT to 5PT may be sequentially formed along an inner surface of the slit SLT. The third to fifth protective layers 3PT to 5PT are layers for protecting the fourth sacrificial layers 4SC or the fourth interlayer insulating layers ITL4 through the slit SLT in a subsequent etching process, and may be formed in an order of a nitride layer, an oxide layer, and a nitride layer. For example, each of the third and fifth protective layers 3PT and 5PT may be formed as a nitride layer, and the fourth protective layer 4PT may be formed as an oxide layer.

Referring to FIG. 6J, an etching process may be performed such that the first sacrificial layer 1SC is exposed through the bottom of the slit SLT. For example, the etching process may be performed as an anisotropic dry etching process such that the third to fifth protective layers 3PT to 5PT formed a side surface of the slit SLT remain and such that the first sacrificial layer 1SC is exposed.

Referring to FIG. 6K, an etching process for removing the first sacrificial layer (1SC shown in FIG. 6J) exposed through the bottom of the slit SLT may be performed. For example, the etching process may be performed as an isotropic dry etching process or a wet etching process. An empty region in which the first sacrificial layer 1SC is removed may be defined as a recess REC. When the first and second protective layers (1PT and 2PT, which are shown in FIG. 6J) remain in the recess REC after the first sacrificial layer 1SC is removed, an etching or cleaning process for removing the first and second protective layers 1PT and 2PT may be additionally performed. Accordingly, the memory layer ML, the first source layer 1SM, and the second source layer 2SM may be exposed through the inside of the recess REC.

Referring to FIG. 6L, etching processes for removing a portion of the memory layer ML through the slit SLT and the recess REC may be performed. Specifically, a portion of the memory layer ML, which is exposed through the recess REC, in the memory layer ML included in the plug PL may be removed. Since the memory layer ML is configured with the blocking layer (BX shown in FIG. 6G), the charge trap layer (CT shown in FIG. 6G), and the tunnel insulating layer (TO shown in FIG. 6G), etching processes for sequentially removing the blocking layer BX, the charge trap layer CT, and the tunnel insulating layer TO, which are exposed through the recess REC, may be sequentially performed. The third to fifth protective layers 3PT to 5PT remaining on the side surface of the slit SLT may also be sequentially removed. Therefore, the channel layer CH included in the plug PL may be exposed through the inside of the recess REC. The exposed portion of the memory layer ML is removed through the recess REC, but a portion of the memory layer ML may be removed even at a portion at which the first and second source layers 1SM and 2SM are formed.

Referring to FIG. 6M, a third source layer 3SM may be formed inside the recess REC through the slit SLT, so that a source structure SL configured with the first to third source layers 1SM to 3SM is formed. For example, since the recess REC is connected to the slit SLT, the third source layer 3SM may be formed along the side surface of the slit SLT, when the inside of the recess REC is filled with the third source layer 3SM. The third source layer 3SM may be formed of a conductive material. For example, the third source layer 3SM may be formed of the same material as the first or second source layer 1SM or 2SM, or be formed of a material having a high content of an impurity as compared with the first or second source layer 1SM or 2SM. For example, the third source layer 3SM may be formed of a conductive material such as poly-silicon.

Referring to FIG. 6N, an etching process for removing a portion of the third source layer 3SM formed in the slit SLT may be performed. Since the third source layer 3SM is formed on side and bottom surfaces of the slit SLT, the etching process for removing the portion of the third source layer 3SM formed in the slit SLT may be performed as an isotropic dry etching process or a wet etching process. The etching process is performed until the third source layer 3SM formed on the side surface of the slit SLT is removed, and therefore, a portion of the third source layer 3SM may remain on the bottom of the slit SLT. When the third source layer 3SM formed on the side surface of the slit SLT is removed, the fourth sacrificial layers (4SC shown in FIG. 6M) may be exposed through the side surface of the slit SLT. Subsequently, an etching process for removing the fourth sacrificial layers 4SC exposed through the slit SLT may be performed. The etching process may be performed by using a source gas or an etchant, which has a high etch selectivity with respect to the fourth sacrificial layers 4SC as compared with the fourth interlayer insulating layers ITL4 such that the fourth interlayer insulating layers ITL4 remain.

Referring to FIG. 6O, conductive layers CD may be filled between the fourth interlayer insulating layers ITL4. The conductive layers CD may be used as word lines or select lines of a memory block. Therefore, the conductive layers CD may be formed of a conductive material. For example, the conductive layers CD may be formed of a metal material such as tungsten (W), molybdenum (Mo), cobalt (Co) or nickel (Ni), or a semiconductor material such as silicon (Si) or poly-silicon (Poly-Si), but the present disclosure is not limited thereto.

Referring to FIG. 6P, an insulating layer IS may be formed along the side surface of the slit SLT, and a source contact SCT may be formed inside the slit SLT in which the insulating layer IS is formed. Since the insulating layer IS is formed along the side surface of the slit SLT, the third source layer 3SM remaining on the bottom of the slit SLT may be exposed through the slit SLT. Subsequently, when a conductive material for the source contact SCT is filled inside the slit SLT, the third source layer 3Sm exposed through the bottom of the slit SLT may be in contact with the source contact SCT. Therefore, when a source voltage is applied to the source contact SCT, the source voltage may be transferred to the channel layer CH through the source structure SL and the compensation layer CS. In an embodiment, the compensation layer CS can reduce a resistance in a region in which the source structure SL is in contact with the plug PL, and thus an electrical characteristic of the memory device using the source structure SL can be improved.

Figure 7:
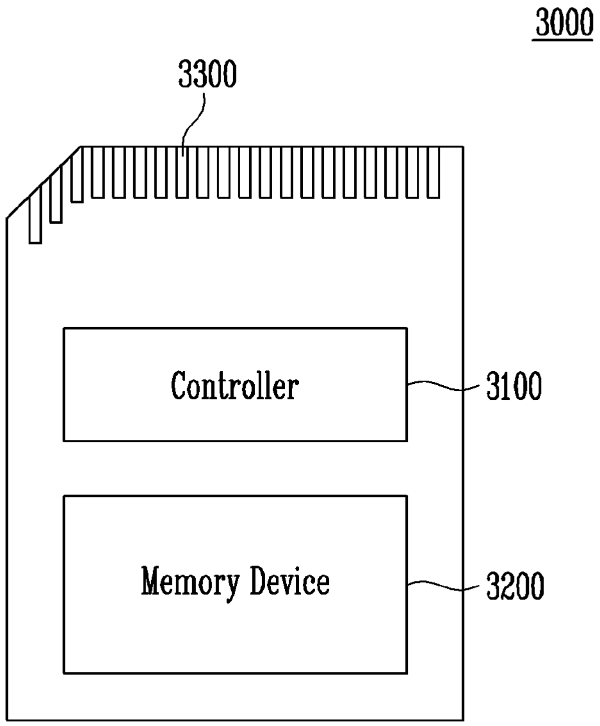
FIG. 7 is a diagram illustrating a memory card system to which the memory device of the present disclosure is applied.

FIG. 7 is a diagram illustrating a memory card system to which the memory device of the present disclosure is applied.

Referring to FIG. 7, the memory card system 3000 includes a controller 3100, a memory device 3200, and a connector 3300.

The controller 3100 may be connected to the memory device 3200. The controller 3100 may access the memory device 3200. For example, the controller 3100 may control a program, read or ease operation, or control a background operation of the memory device 3200. The controller 3100 may provide an interface between the memory device 3200 and a host. The controller 3100 may drive firmware for controlling the memory device 3200. For example, the controller 3100 may include components such as a Random Access Memory (RAM), a processing unit, a host interface, a memory interface, and the error corrector.

The controller 3100 may communicate with an external device through the connector 3300. The controller 3100 may communicate with the external device (e.g., the host) according to a specific communication protocol. Exemplarily, the controller 3100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. For example, the connector 3300 may be defined by at least one of the above-described various communication protocols.

The memory device 3200 may include a plurality of memory cells, and be configured identically to the memory device 1100 shown in FIG. 1.

The controller 3100 and the memory device 3200 may be integrated into a single semiconductor device, to constitute a memory card. For example, the controller 3100 and the memory device 3200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 8:
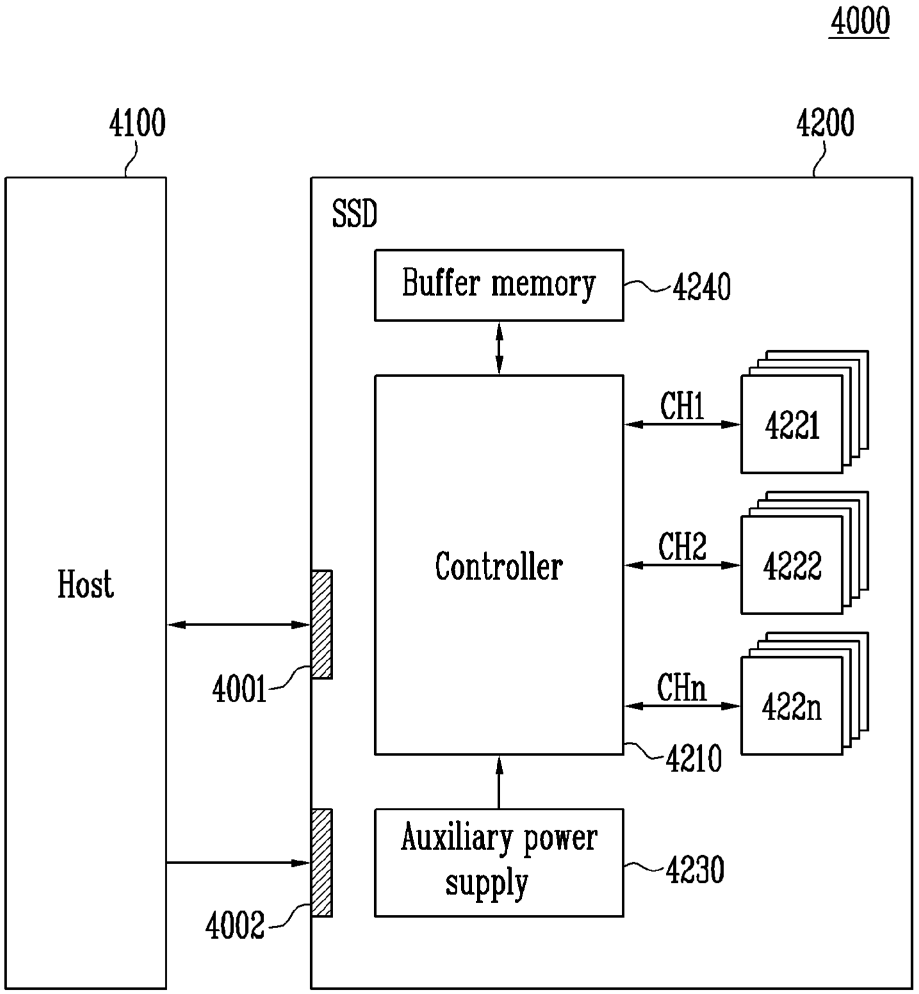
FIG. 8 is a diagram illustrating a Solid State Drive (SSD) system to which the memory device of the present disclosure is applied.

FIG. 8 is a diagram illustrating a Solid State Drive (SSD) system to which the memory device of the present disclosure is applied.

Referring to FIG. 8, the SSD system 4000 includes a host 4100 and an SSD 4200. The SSD 4200 exchanges a signal with the host 4100 through a signal connector 4001, and receives power through a power connector 4002. The SSD 4200 includes a controller 4210, a plurality of memory devices 4221 to **422*n*, an auxiliary power supply 4230, and a buffer memory 4240**.

The controller 4210 may control the plurality of memory devices 4221 to **422*n* in response to a signal received from the host 4100. Exemplarily, the signal may be a signal based on an interface between the host 4100 and the SSD 4200**. For example, the signal may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The plurality of memory devices 4221 to 422*n* may include a plurality of memory cells configured to store data. Each of the plurality of memory devices 4221 to 422*n* may be configured identically to the memory device 1100 shown in FIG. 1. The plurality of memory devices 4221 to 422*n* may communicate with the controller 4210 through channels CH1 to CHn.

The auxiliary power supply 4230 may be connected to the host 4100 through the power connector 4002. The auxiliary power supply 4230 may receive power PWR input from the host 4100 and charge the power PWR. When the supply of power from the host 4100 is not smooth, the auxiliary power supply 4230 may provide power of the SSD 4200. Exemplarily, the auxiliary power supply 4230 may be located in the SSD 4200, or be located at the outside of the SSD 4200. For example, the auxiliary power supply 4230 may be located on a main board, and provide auxiliary power to the SSD 4200.

The buffer memory 4240 may operate as a buffer memory of the SSD 4200. For example, the buffer memory 4240 may temporarily store data received from the host 4100 or data received from the plurality of memory devices 4221 to 422*n*, or temporarily store meta data (e.g., a mapping table) of the memory devices 4221 to 422*n*. The buffer memory 4240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

In accordance with the present disclosure, in an embodiment, a resistance between a source structure and a plug can be reduced.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:

a source structure; and a stack structure disposed over the source structure in a first direction, the stack structure including a plug and a slit, wherein the slit includes a source contact connected to the source structure, wherein a region in which the plug and the source structure overlap in the first direction includes a compensation layer, the compensation layer includes a first concentration of an impurity and the source structure includes a second concentration of the impurity, and the first concentration is greater than the second concentration, and wherein the compensation layer does not overlap the stack structure in a second direction crossing the first direction.

2. The memory device of claim 1, wherein the compensation layer, which is in contact with the plug, is formed at a portion inside the source structure.

3. The memory device of claim 1, wherein the impurity includes one of phosphorous and boron ion.

4. The memory device of claim 1, wherein the plug is formed inside a plug hole penetrating the stack structure and a landing hole penetrating a portion of the source structure.

5. The memory device of claim 4, wherein the plug includes:

a core pillar formed inside the plug hole and the landing hole;

a channel layer surrounding the periphery of the core pillar; and a memory layer surrounding the periphery of the channel layer.

6. The memory device of claim 5, wherein, in the region in which the source structure and the plug overlap in the first direction, a first portion of the memory layer is isolated from a second portion of the memory layer in a vertical direction.

7. The memory device of claim 6, wherein, in the region in which the source structure and the plug overlap in the first direction, the compensation layer is formed between the first portion of the memory layer and the source structure and between the second portion of the memory layer and the source structure.

8. The memory device of claim 5, wherein the core pillar and the channel layer extend from an uppermost end to a lowermost end of the plug.

9. The memory device of claim 1, wherein the source structure comprises poly-silicon containing the impurity.

10. The memory device of claim 1, wherein the stack structure includes conductive layers and interlayer insulating layers, which are alternately stacked.

11. A memory device comprising:

a first source layer;

a stack structure disposed over the first source layer in a first direction;

a plug penetrating the stack structure in the first direction and extending into the first source layer; and a first compensation layer disposed between the first source layer and the plug, wherein the first compensation layer includes a first concentration of an impurity and the first source layer includes a second concentration of the impurity, and the first concentration is greater than the second concentration, and wherein the first compensation layer does not overlap the stack structure in a second direction crossing the first direction.

12. The memory device of claim 11, further comprising:

a second source layer disposed between the first source layer and the stack structure;

a third source layer disposed between the first source layer and the second source layer; and a second compensation layer disposed between the second source layer and the plug.

13. The memory device of claim 12, wherein the second compensation layer includes a third concentration of the impurity and the second source layer includes a fourth concentration of the impurity, and the third concentration is greater than the fourth concentration.

14. The memory device of claim 12, wherein the first compensation layer and the second compensation layer are spaced apart from each other in the first direction.

15. The memory device of claim 12, wherein the plug includes a channel layer penetrating the stack structure, the second source layer, and the third source layer, and extending into the first source layer, and wherein the third source layer is in contact with the channel layer.

16. The memory device of claim 15, wherein the plug includes a first memory pattern disposed between the channel layer and the stack structure, and a second memory pattern disposed between the channel layer and the first source layer.

17. The memory device of claim 16, wherein the third source layer extends between the first compensation layer and the channel layer towards the second memory pattern, and wherein the third source layer extends between the second compensation layer and the channel layer towards the first memory pattern.

18. The memory device of claim 12, further comprising a source contact penetrating the stack structure and the second source layer, wherein the source contact is in contact with the third source layer.

19. The memory device of claim 18, further comprising an insulating layer disposed between the source contact and the stack structure.

20. The memory device of claim 12, wherein the first compensation layer surrounds a lower portion of the plug.

* * * * *